(12) United States Patent
Lee et al.

(10) Patent No.: US 12,550,493 B2
(45) Date of Patent: Feb. 10, 2026

(54) DISPLAY DEVICE AND METHOD FOR MANUFACTURING THE SAME

(71) Applicant: Samsung Display Co., LTD., Yongin-si (KR)

(72) Inventors: Jin Woo Lee, Suwon-si (KR); Jeong Nyun Kim, Asan-si (KR); Zu Seok Oh, Cheonan-si (KR); Jeong Hyun Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 619 days.

(21) Appl. No.: 17/973,756

(22) Filed: Oct. 26, 2022

(65) Prior Publication Data

US 2023/0317887 A1    Oct. 5, 2023

(30) Foreign Application Priority Data

Mar. 23, 2022  (KR) .......................... 10-2022-0036009

(51) Int. Cl.
| | | |
|---|---|---|
| *H10H 20/84* | (2025.01) | |
| *H01L 25/16* | (2023.01) | |
| *H10H 20/01* | (2025.01) | |
| *H10H 20/825* | (2025.01) | |

(52) U.S. Cl.
CPC ........... *H10H 20/84* (2025.01); *H01L 25/167* (2013.01); *H10H 20/01335* (2025.01); *H10H 20/034* (2025.01); *H10H 20/825* (2025.01)

(58) Field of Classification Search
CPC ... H10H 20/84; H10H 20/01335; H10H 20/01
See application file for complete search history.

(56) References Cited

U.S. PATENT DOCUMENTS

| | | | |
|---|---|---|---|
| 2012/0206675 A1* | 8/2012 | Seo ...................... | H10K 50/852 |
| | | | 257/E33.072 |
| 2020/0165517 A1* | 5/2020 | Lee ...................... | C09K 11/025 |
| 2021/0035962 A1* | 2/2021 | Jung ...................... | H01L 24/95 |
| 2021/0057610 A1* | 2/2021 | Yang ...................... | H10K 59/353 |
| 2021/0313533 A1* | 10/2021 | Zhang .................. | H10K 50/171 |
| 2022/0352244 A1* | 11/2022 | Kang ...................... | H10H 20/01 |

FOREIGN PATENT DOCUMENTS

| | | |
|---|---|---|
| KR | 10-2010-0055155 | 5/2010 |
| KR | 10-2020-0023581 | 3/2020 |

* cited by examiner

*Primary Examiner* — William B Partridge
*Assistant Examiner* — Felix B Andrews
(74) *Attorney, Agent, or Firm* — Womble Bond Dickinson (US) LLP

(57) ABSTRACT

Embodiments provide a display device and a method for manufacturing the same. The display device includes a first electrode and a second electrode disposed on a substrate, spaced apart from each other, and extending in a direction, light-emitting elements disposed on the first electrode and the second electrode, an organic ligand having a polarity that is bonded to a portion of each of the light-emitting elements, a first connection electrode electrically connected to an end of each of the plurality of light-emitting elements, and a second connection electrode electrically connected to another end of each of the plurality of light-emitting elements. The end of each of the plurality of light-emitting elements electrically contacts the first electrode, and the another end of each of the plurality of light-emitting elements electrically contacts the second electrode.

18 Claims, 26 Drawing Sheets

DISPLAY DEVICE AND METHOD FOR MANUFACTURING THE SAME

CROSS-REFERENCE TO RELATED APPLICATION(S)

This application claims priority to and benefits of Korean Patent Application No. 10-2022-0036009 under 35 U.S.C. § 119, filed on Mar. 23, 2022, in the Korean Intellectual Property Office (KIPO), the entire contents of which are incorporated herein by reference.

BACKGROUND

1. Technical Field

The disclosure relates to a display device and a method for manufacturing the same.

2. Description of Related Art

A display device has become more important under the development of multimedia. In response to this trend, various types of the display devices such as an organic light-emitting display device (OLED), a liquid crystal display device (LCD), etc. have been used.

A display device that displays an image has a display panel such as an organic light-emitting display panel or a liquid crystal display panel. The light-emitting display panel may include a light-emitting element. For example, a light-emitting diode (LED) as the light-emitting element may include an organic light-emitting diode OLED using an organic material as a light-emitting material and an inorganic light-emitting diode using an inorganic material as the light-emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A purpose of the disclosure is to provide embodiments of a display device and a method for manufacturing the same in which an end of each of light-emitting elements has a polarity such that alignment of the light-emitting elements between electrodes may be improved.

Purposes according to the disclosure are not limited to the above-mentioned purpose. Other purposes and advantages according to the disclosure that are not mentioned may be understood based on following descriptions, and may be more clearly understood based on embodiments according to the disclosure. Further, it will be understood that the purposes and advantages according to the disclosure may be realized using embodiments shown in the claims and combinations thereof.

According to an embodiment of the disclosure, a display device may include a first electrode and a second electrode disposed on a substrate, spaced apart from each other, and extending in a direction, light-emitting elements disposed on the first electrode and the second electrode, an organic ligand having a polarity that is bonded to a portion of each of the light-emitting elements, a first connection electrode electrically connected to an end of each of the light-emitting elements, and a second connection electrode electrically connected to another end of each of the light-emitting elements. The end of each of the light-emitting elements may electrically contact the first electrode, and the another end of each of the light-emitting elements may electrically contact the second electrode.

In an embodiment, each of the light-emitting elements may include a first semiconductor layer including an n-type semiconductor, a second semiconductor layer disposed on the first semiconductor layer and including a p-type semiconductor, a light-emitting layer disposed between the first semiconductor layer and the second semiconductor layer, and an insulating film surrounding a circumferential surface of each of the first semiconductor layer, the second semiconductor layer, and the light-emitting layer. The organic ligand may be bonded to a surface of the insulating film.

In an embodiment, the organic ligand may have a negative polarity, and the organic ligand may include oleic acid or PEG-COOH.

In an embodiment, the organic ligand may be bonded to a portion of the surface of the insulating film corresponding to the second semiconductor layer.

In an embodiment, each of the light-emitting elements may further include an electrode layer disposed on the second semiconductor layer, and the organic ligand may be bonded to a portion of the surface of the insulating film corresponding to the second semiconductor layer and the electrode layer.

In an embodiment, the organic ligand may not be bonded to a portion of the surface of the insulating film corresponding to the first semiconductor layer and the light-emitting layer.

In an embodiment, the organic ligand may have a positive polarity, and the organic ligand may include n-octyl mercaptan, PEG-NH$_2$, or oleylamine.

In an embodiment, the organic ligand may be bonded to a portion of the surface of the insulating film corresponding to the first semiconductor layer.

In an embodiment, each of the light-emitting elements may further include an electrode layer disposed on the first semiconductor layer, and the organic ligand may be bonded to a portion of the surface of the insulating film corresponding to the first semiconductor layer and the electrode layer.

In an embodiment, the organic ligand may not be bonded to a portion of the surface of the insulating film corresponding to the second semiconductor layer and the light-emitting layer.

In an embodiment, at least two of the light-emitting elements may have different lengths from each other, the at least two of the light-emitting elements may each have an area overlapping the first electrode or the second electrode in a plan view, and a length of each of the overlapping areas may be equal to each other.

According to an embodiment of the disclosure, a display device may include a first electrode disposed on a substrate and extending in a direction, second electrodes disposed on the substrate and extending in the direction, a first light-emitting element disposed on one of the second electrodes and the first electrode, and a second light-emitting element disposed on the other of the second electrodes and the first electrode. The first electrode may be disposed between the second electrodes, an organic ligand having a polarity may be bonded to a portion of each of the first light-emitting element and the second light-emitting element, and the portion of each of the first light-emitting element and the second light-emitting element may overlap the first electrode in a plan view.

In an embodiment, each of the first light-emitting element and the second light-emitting element may include a first semiconductor layer including an n-type semiconductor, a second semiconductor layer disposed on the first semiconductor layer and including a p-type semiconductor, a light-emitting layer disposed between the first semiconductor layer and the second semiconductor layer, and an insulating film surrounding a circumferential surface of each of the first semiconductor layer, the second semiconductor layer, and the light-emitting layer, and the organic ligand may be bonded to a portion of a surface of the insulating film corresponding to the second semiconductor layer.

In an embodiment, the second semiconductor layer of each of the first light-emitting element and the second light-emitting element may overlap the first electrode in a plan view.

According to an embodiment of the disclosure, a method for manufacturing a display device, the method may include sequentially stacking a first semiconductor material layer, a light-emitting material layer, a second semiconductor material layer and an electrode material layer on a base substrate, etching the first semiconductor material layer, light-emitting material layer, the second semiconductor material layer and the electrode material layer to form the first semiconductor material layer including a base layer and protrusions, a light-emitting layer, a second semiconductor layer and an electrode layer, respectively, forming an insulating film surrounding the protrusions of the first semiconductor material layer, the light-emitting layer, the second semiconductor layer, and the electrode layer, forming a photoresist such that the second semiconductor layer, the electrode layer, and a portion of the insulating film corresponding to the second semiconductor layer and the electrode layer are each exposed, bonding an organic ligand having a polarity to the portion of the insulating film, forming light-emitting elements by separating the protrusions of the first semiconductor material layer from the base layer of the first semiconductor material layer, spraying light-emitting element ink including the light-emitting elements on a target substrate on which a first electrode and a second electrode spaced apart from each other are formed, and aligning the light-emitting elements by applying an alignment signal to the first electrode and the second electrode. In an embodiment, the alignment signal may be direct current (DC) power.

In an embodiment, the organic ligand may be bonded to an end of each of the light-emitting elements, and in the aligning of the light-emitting elements, the end of each of the light-emitting elements may move to the first electrode or the second electrode having a polarity opposite to the polarity of the organic ligand.

In an embodiment, the bonding of the organic ligand may include immersing the base substrate into a solution containing the organic ligand.

In an embodiment, the method may further include removing the photoresist after bonding the organic ligand to the portion of the insulating film.

In an embodiment, the organic ligand may include at least one selected from a group consisting of oleic acid, PEG-COOH, n-octyl mercaptan, PEG-$NH_2$, and oleylamine.

It is to be understood that the embodiments above are described in a generic and explanatory sense only and not for the purpose of limitation, and the disclosure is not limited to the embodiments described above.

According to the display device and the method for manufacturing the same according to embodiments, the organic ligand having a polarity may be bonded to a desired portion of the light-emitting element. Accordingly, alignment of the light-emitting elements between the electrodes may be readily achieved and improved.

Further, the light-emitting layers of the light-emitting elements may be disposed adjacent to the first electrode disposed at a center of a sub-pixel, such that each light-emitting element may emit light in a central area of the sub-pixel to improve luminance.

Effects of the disclosure are not limited to the above-mentioned effects, and other effects not mentioned will be clearly understood by those skilled in the art from following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
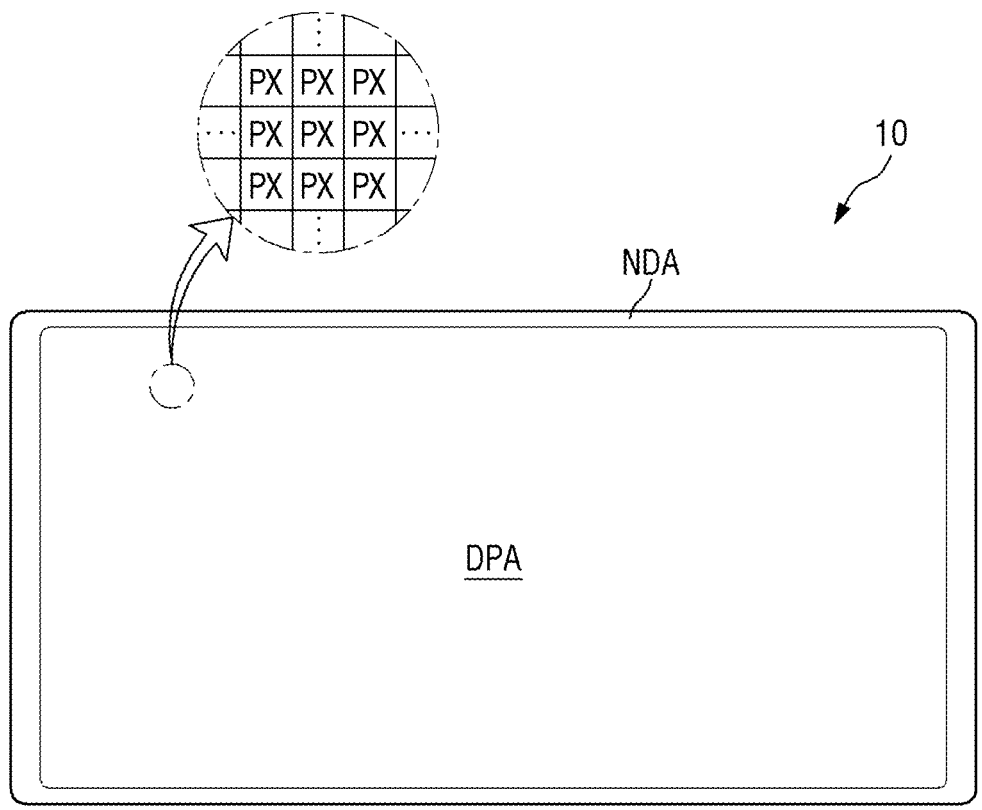
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, embodiments are provided so that this disclosure will be more thorough and complete, and will more fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

When a certain embodiment is implemented differently, a specific process order may be performed differently from the described order. For example, two processes described in succession may be performed substantially simultaneously, or may be performed in an order opposite to the described order.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Each of the features of the embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

FIG. 1 is a schematic plan view of a display device according to an embodiment.

Referring to FIG. 1, a display device 10 may display a video or a still image. The display device 10 may be any electronic device that provides a display screen. For example, the display device 10 may include a televisions, a laptop, a monitors, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 10 may include a display panel that provides a display screen. Examples of the display panel may include an inorganic light-emitting diode display panel, an organic light-emitting display panel, a quantum dot light-emitting display panel, a plasma display panel, and a field emission display panel. Hereinafter, an embodiment in which an inorganic light-emitting diode display panel is embodied as the display panel will be described. However, the disclosure is not limited thereto. In case that the same technical idea is applicable to other display panels, the disclosure may also be applied to other display panels.

In the drawings for illustrating the display device 10, the first direction DR1, the second direction DR2, and the third direction DR3 are defined. The first direction DR1 and the second direction DR2 may be perpendicular to each other and constitute a plane. The third direction DR3 may be normal to the plane which the first direction DR1 and the second direction DR2 constitute. The third direction DR3 may be perpendicular to each of the first direction DR1 and the second direction DR2. In an embodiment describing the display device 10, the third direction DR3 may be a thickness direction of the display device 10.

A shape of the display device 10 may be variously modified. For example, the display device 10 may have a rectangular shape including a long-side extending in the first direction DR1 and a short-side extending in the second direction DR2 in a plan view. In another example, the display device 10 may have a rectangular shape including a long-side extending in the second direction DR2 and a short-side extending in the first direction DR1 in a plan view. However, the disclosure is not limited thereto. The display device 10 may have a shape such as a square, a rectangle with rounded corners, other polygons, or a circle. A shape of a display area DPA of the display device 10 may be similar to an overall shape of the display device 10. In FIG. 1, an embodiment in which each of the display device 10 and the display area DPA has a rectangular shape having a long-side extending in the first direction DR1 and a short-side extending in the second direction DR2 is illustrated.

The display device 10 may include a display area DPA and a non-display area NDA. The display area DPA may be an area where an image may be displayed, and the non-display area NDA may be an area where an image is not displayed. The display area DPA may be referred to as an active area, and the non-display area NDA may be referred to as a non-active area. The display area DPA may occupy generally an inner region of the display device 10.

The display area DPA may include multiple pixels PX. The pixels PX may be arranged in a matrix form. A shape of each pixel PX may be rectangular or square in a plan view. However, the disclosure is not limited thereto. The shape thereof may be a rhombus shape in which each side is inclined relative to a direction. The pixels PX may be arranged in a stripe or in a PenTile™ pattern. Further, each of the pixel PXs may include one or more light-emitting elements emitting light of a wavelength band to display a color.

The non-display area NDA may be disposed adjacent to the display area DPA. The non-display area NDA may completely or partially surround the display area DPA. The display area DPA may have a rectangular shape, while non-display area NDA may be disposed adjacent to each of four sides of the display area DPA. The non-display area NDA may constitute a bezel of the display device 10. Lines or circuit drivers included in the display device 10 may be disposed in the non-display area NDA. External devices may be mounted to the non-display area NDA.

Figure 2:
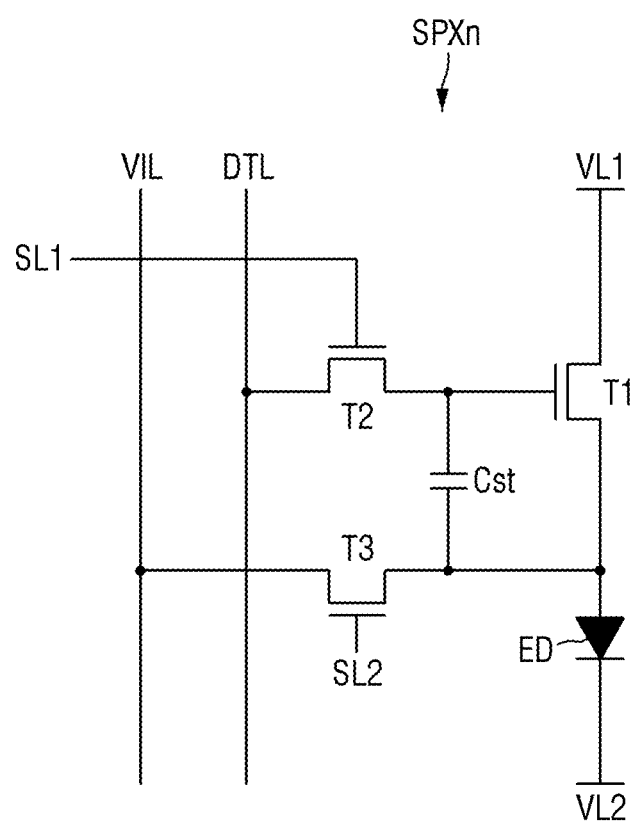
FIG. 2 is a schematic diagram of an equivalent circuit of a sub-pixel of a display device according to an embodiment.

FIG. 2 is a schematic diagram of an equivalent circuit of a sub-pixel of a display device according to an embodiment.

Referring to FIG. 2, each sub-pixel SPXn of the display device 10 according to an embodiment may include a light-emitting element ED, three transistors T1, T2, and T3, and one storage capacitor Cst.

The light-emitting element ED may emit light in response to a current supplied thereto through a first transistor T1. The light-emitting element ED may emit light of a wavelength band in response to an electrical signal transmitted from the first electrode and the second electrode respectively electrically connected to both opposing ends thereof.

An end of the light-emitting element ED may be electrically connected to a source electrode of the first transistor T1, and another end thereof may be electrically connected to a second voltage line VL2 to which a low-potential voltage (hereinafter, a second power voltage) lower than a high-potential voltage (hereinafter, a first power voltage) of a first voltage line VL1 is supplied.

The first transistor T1 may adjust a current flowing from the first voltage line VL1 to which the first power voltage is supplied to the light-emitting element ED, based on a difference between voltages of a gate electrode and the source electrode thereof. In an embodiment, the first transistor T1 may act as a driving transistor for driving the light-emitting element ED. The gate electrode of the first transistor T1 may be electrically connected to a source electrode of the second transistor T2, the source electrode thereof may be electrically connected to an end of the light-emitting element ED, and a drain electrode thereof may be electrically connected to the first voltage line VL1 to which the first power voltage is applied.

The second transistor T2 may be turned on by a scan signal through a first scan line SL1 to electrically connect a data line DTL to the gate electrode of the first transistor T1. A gate electrode of the second transistor T2 may be electrically connected to the first scan line SL1, the source electrode thereof may be electrically connected to the gate electrode of the first transistor T1, and a drain electrode thereof may be electrically connected to the data line DTL.

The third transistor T3 may be turned on by a scan signal through a second scan line SL2 to electrically connect an initialization voltage line VIL to an end of the light-emitting element ED. A gate electrode of the third transistor T3 may be electrically connected to the second scan line SL2, a drain electrode thereof may be electrically connected to the initialization voltage line VIL, and a source electrode thereof may be electrically connected to an end of the light-emitting element ED and the source electrode of the first transistor T1. In the drawing, the first scan line SL1 and the second scan line SL2 are shown separately. However, the disclosure is not limited thereto. In embodiments, the first scan line SL1 and the second scan line SL2 may be integrated into a single line. The second transistor T2 and the third transistor T3 may be simultaneously turned on by a same scan signal.

Figure 4:
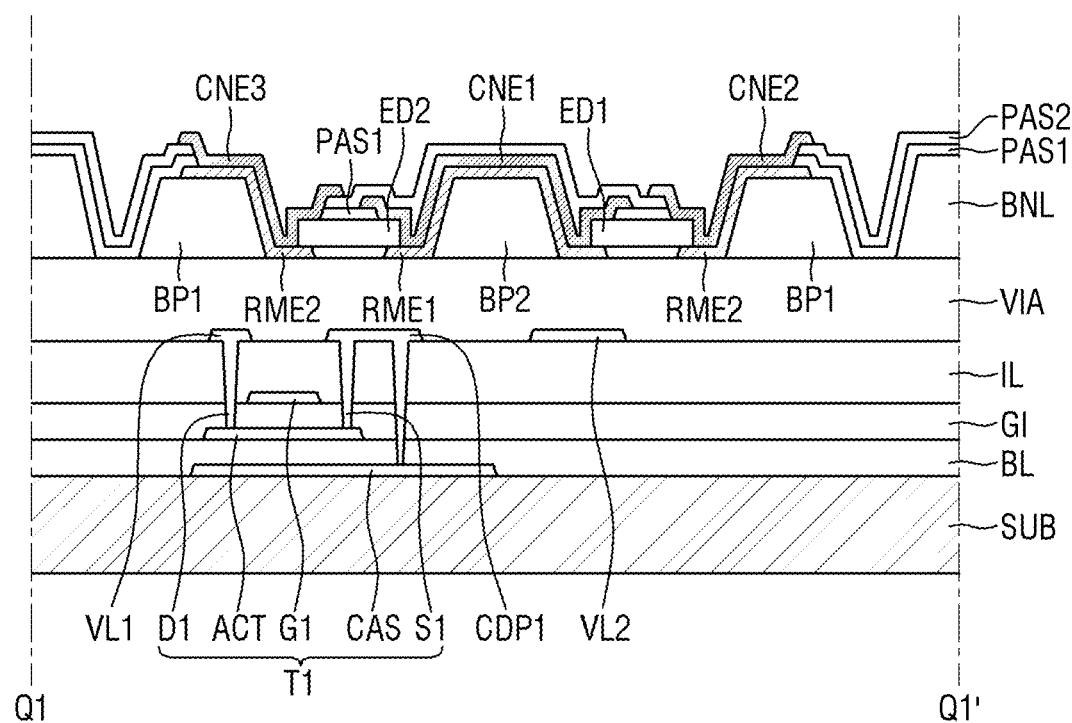
FIG. 4 is a schematic cross-sectional view taken along line Q1-Q1' in FIG. 3.
Figure 4:
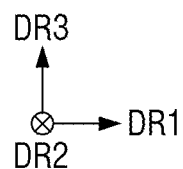

The source electrode and the drain electrode of each of the transistors T1, T2, and T3 are not limited to the above configuration. For example, the source electrode and the drain electrode of each of the transistors T1, T2, and T3 may have a configuration different from the above configuration. Each of the transistors T1, T2, and T3 may be embodied as a thin-film transistor. In FIG. 4, a case in which each of the transistors T1, T2, and T3 is embodied as an N-type MOSFET (Metal Oxide Semiconductor Field Effect Transistor) is shown. However, the disclosure is not limited thereto. For example, each of the transistors T1, T2, and T3 may be embodied as a P-type MOSFET. In another embodiment, some thereof may be embodied as an N-type MOSFET, and the other thereof may be embodied as a P-type MOSFET.

The storage capacitor Cst may be disposed between the gate electrode and the source electrode of the first transistor T1. The storage capacitor Cst may store therein a difference of voltage between a gate voltage and a source voltage of the first transistor T1.

Hereinafter, a structure of the sub-pixel SPX constituting a pixel of the display device 10 according to an embodiment will be described in detail with reference to other drawings.

Figure 3:
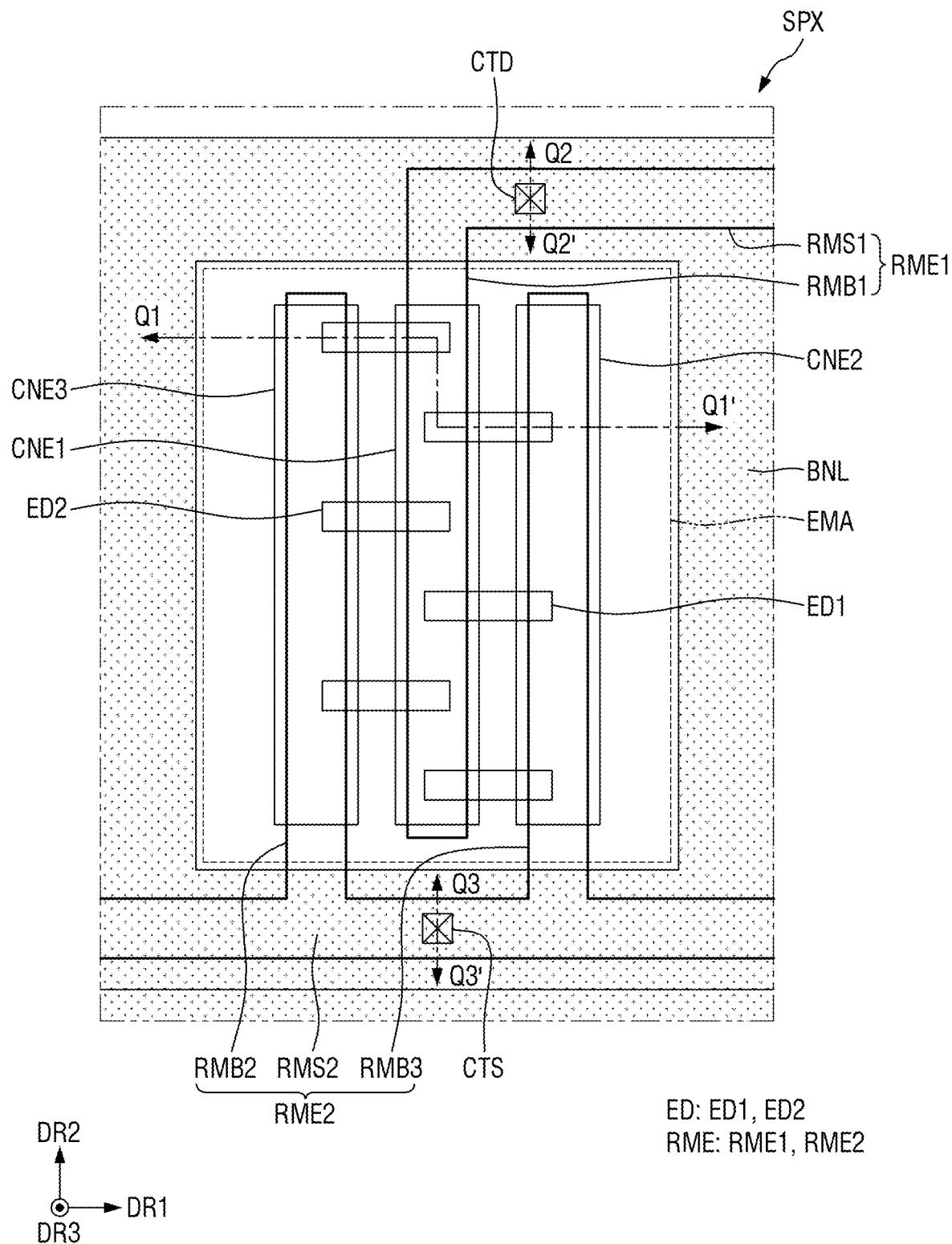
FIG. 3 is a plan view schematically showing a sub-pixel of a display device according to an embodiment.
Figure 5:
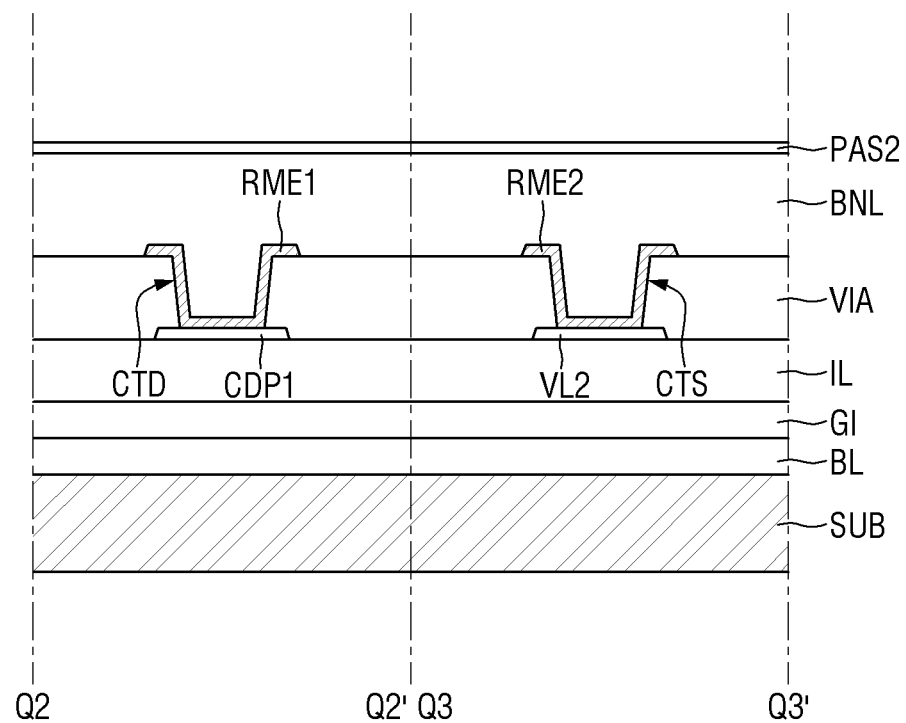
FIG. 5 is a schematic cross-sectional view taken along line Q2-Q2' and line Q3-Q3' in FIG. 3.

FIG. 3 is a plan view schematically showing a sub-pixel of a display device according to an embodiment. FIG. 4 is a schematic cross-sectional view taken along line Q1-Q1' in FIG. 3. FIG. 5 is a schematic cross-sectional view taken along line Q2-Q2' and line Q3-Q3' in FIG. 3.

Referring to FIG. 3 to FIG. 5, a display device according to an embodiment may include multiple sub-pixels SPX. Three or more of the sub-pixels SPX may constitute one pixel. Each sub-pixel SPX may emit light of a first color, a second color, or a third color. For example, the first color may be blue, the second color may be green, and the third color may be red. However, the disclosure is not limited thereto, and the sub-pixels SPX may emit light of the same color.

Each sub-pixel SPX of the display device 10 may include a light-emitting area EMA and a non-light-emitting area (not referenced). The light-emitting area EMA may be an area in which the light-emitting element ED is disposed and thus from which light in a wavelength band is emitted. The non-light-emitting area may be an area in which the light-emitting element ED is not disposed, and which light emitted from the light-emitting element ED does not reach, and thus from which light is not emitted. The light-emitting area may include an area in which the light-emitting element ED is disposed, and an area adjacent to the light-emitting element ED and from which light emitted from the light-emitting element ED is emitted.

However, the disclosure is not limited thereto. The light-emitting area EMA may include an area from which the light emitted from the light-emitting element ED is reflected or refracted by other members and is directed. Multiple light-emitting elements ED may be arranged in each sub-pixel SPX. An area in which the elements ED are disposed and an area adjacent thereto may constitute the light-emitting area EMA.

The light-emitting area EMA may be defined by a bank layer BNL disposed on a substrate. The light-emitting elements ED may be disposed in the light-emitting area EMA. An area other than the light-emitting area EMA, for example, an area overlapping the bank layer BNL and an area outside the bank layer BNL may constitute a non-light-emitting area.

The display device 10 according to an embodiment may include a substrate SUB and a semiconductor layer, conductive layers, and insulating layers disposed on the substrate SUB. The semiconductor layer, the conductive layer, and the insulating layers may constitute a circuit layer and a display element layer of the display device 10.

For example, the substrate SUB may be an insulating substrate. The substrate SUB may include an insulating material such as glass, quartz, or polymer resin. The substrate SUB may be a rigid substrate, or may be a flexible substrate capable of bending, folding, rolling, etc.

A first conductive layer may be disposed on the substrate SUB. The first conductive layer may include a lower metal layer CAS, and the lower metal layer CAS may be disposed to overlap an active layer ACT of a first transistor T1. The lower metal layer CAS may include a light-blocking material to prevent light from entering the active layer ACT of the first transistor T1. However, the lower metal layer CAS may be omitted.

A buffer layer BL may be disposed on the lower metal layer CAS and the substrate SUB. The buffer layer BL may be formed on the substrate SUB to protect transistors from moisture penetrating through the substrate SUB, which is vulnerable to moisture permeation, and may perform a surface planarization function.

The semiconductor layer may be disposed on the buffer layer BL. The semiconductor layer may include the active layer ACT of the first transistor T1. The active layer ACT may be disposed to partially overlap a gate electrode G1 of the second conductive layer, which will be described later.

The semiconductor layer may include polycrystalline silicon, single crystal silicon, oxide semiconductor, and the like. In another embodiment, the semiconductor layer may include (or be formed of) polycrystalline silicon. The oxide semiconductor may be an oxide semiconductor containing indium (In). For example, the oxide semiconductor may include Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), Indium Gallium Zinc Tin Oxide (IGZTO), or a combination thereof.

Although the drawing illustrates that one first transistor T1 is disposed in the sub-pixel SPX of the display device 10, the disclosure is not limited thereto, and the display device 10 may include a larger number of transistors.

A gate insulating layer G1 may be disposed on the active layer ACT. The gate insulating layer G1 may serve as a gate insulating film of the first transistor T1.

A second conductive layer may be disposed on the gate insulating layer G1. The second conductive layer may include the gate electrode G1 of the first transistor T1. The gate electrode G1 may be disposed to overlap a channel area of the active layer ACT in the third direction DR3, which is the thickness direction.

An interlayer insulating layer IL may be disposed on the second conductive layer. The interlayer insulating layer IL may function as an insulating film between the second conductive layer and other layers disposed thereon and may protect the second conductive layer.

A third conductive layer may be disposed on the interlayer insulating layer IL. The third conductive layer may include a first voltage line VL1 and a second voltage line VL2, and a first conductive pattern CDP1.

The first voltage line VL1 may receive a high potential voltage (or a first power voltage delivered to a first electrode RME1). A low-potential voltage (or a second power voltage) transmitted to a second electrode RME2 may be applied to the second voltage line VL2. The first voltage line VL1 may electrically contact the active layer ACT of the first transistor T1 via a contact hole which extends through the interlayer insulating layer IL and the gate insulating layer G1. The first voltage line VL1 may serve as a first drain electrode D1 of the first transistor T1. The second voltage line VL2 may be directly connected to the second electrode RME2, which will be described later. The first voltage line VL1 may be electrically connected to a first connection electrode CNE1 to be described later, and the second voltage line VL2 may be electrically connected to a second connection electrode CNE2 to be described later.

The first conductive pattern CDP1 may electrically contact the active layer ACT of the first transistor T1 via a contact hole extending through the interlayer insulating layer IL and the gate insulating layer G1. The first conductive pattern CDP1 may electrically contact the lower metal layer CAS via another contact hole. The first conductive pattern CDP1 may serve as a source electrode S1 of the first transistor T1.

Each of the buffer layer BL, the gate insulating layer G1, and the interlayer insulating layer IL as above-described may be embodied as multiple inorganic layers alternately stacked each other. For example, each of the buffer layer BL, the gate insulating layer G1, and the interlayer insulating layer IL may be embodied as a stack of two inorganic layers including at least one of silicon oxide ($SiO_x$), silicon nitride ($SiN_x$), or silicon oxynitride ($SiO_xN_y$) or may be embodied as a stack in which multiple inorganic layers including at least one of silicon oxide ($SiO_x$), silicon nitride ($SiN_x$), or silicon oxynitride ($SiO_xN_y$) are alternately stacked each other. However, the disclosure is not limited thereto. Each of the buffer layer BL, the gate insulating layer G1, and the interlayer insulating layer IL may be embodied as one inorganic layer including the insulating material described above. Further, in embodiments, the interlayer insulating layer IL may include an organic insulating material such as polyimide (PI).

Each of the second conductive layer and the third conductive layer may be embodied as a single layer or multiple layers made include molybdenum (Mo), aluminum (Al), chromium (Cr), gold (Au), titanium (Ti), nickel (Ni), neodymium (Nd), copper (Cu), or a combination thereof. However, the disclosure is not limited thereto.

A via layer VIA may be disposed on the interlayer insulating layer IL and the third conductive layer. The via layer VIA may include an organic insulating material such as polyimide (PI) and may perform a surface planarization function.

On the via layer VIA, a display element layer may be disposed which includes electrodes RME: RME1 and RME2, bank patterns BP1 and BP2, light-emitting elements ED: ED1 and ED2, and connection electrodes CNE: CNE1, CNE2, and CNE3. Further, insulating layers PAS1 and PAS2 may be disposed on the via layer VIA.

The bank patterns BP1 and BP2 may be directly disposed on the via layer VIA. The bank patterns BP1 and BP2 may include first bank patterns BP1 and second bank patterns BP2. The first bank patterns BP1 may be disposed in the light-emitting area EMA of the sub-pixel SPX. Each of the first bank patterns BP1 may have a shape extending in the second direction DR2 and the first bank patterns BP1 may be spaced apart from each other in the first direction DR1. The first bank patterns BP1 may have the same width. However, the disclosure is not limited thereto. The first bank patterns BP1 may have different widths. A length of each of the first bank patterns BP1 extending in the second direction DR2 may be smaller than a length of the light-emitting area EMA in the second direction DR2 surrounded with the bank layer BNL.

The second bank pattern BP2 may be disposed in the light-emitting area EMA of the sub-pixel SPX, and may have a shape extending in the second direction DR2. The second bank pattern BP2 may be disposed between the first bank patterns BP1 and spaced apart from the first bank patterns BP1. The second bank pattern BP2 may have an island-like pattern extending in the second direction DR2 over an entirety of the display area DPA and having a narrow width in the light-emitting area EMA of each sub-pixel SPX.

The second bank pattern BP2 may be disposed at a center of the light-emitting area EMA. The first bank patterns BP1 may be spaced from each other and the second bank pattern BP2 may be interposed therebetween. The first bank patterns BP1 and the second bank pattern BP2 may be alternately arranged in the first direction DR1. The light-emitting elements ED may be disposed between the first bank patterns BP1 and the second bank pattern BP2 spaced apart from each other.

Each of the first bank patterns BP1 and the second bank pattern BP2 may have the same length in the second direction DR2, but may have different widths in the first direction DR1. Each of the bank patterns BP1 and BP2 may be formed in an island-shaped pattern extending over an entirety of the display area DPA. The light-emitting elements ED may be disposed between the bank patterns BP1 and BP2 spaced apart from each other.

Each of the bank patterns BP1 and BP2 may have a structure in which at least a portion thereof protrudes from a top surface of the via layer VIA. The protruding portion of each of the bank patterns BP1 and BP2 may have an inclined or curved side surface. Unlike illustrated in the drawings, each of the bank patterns BP1 and BP2 may have a semicircle or semielliptical shape in a cross-sectional view. Each of the bank patterns BP1 and BP2 may include an organic insulating material such as polyimide (PI). However, the disclosure is not limited thereto.

The electrodes RME may be arranged in each sub-pixel SPX. Each of the electrodes RME may extend in the first direction DR1 in the non-light-emitting area and may extend in the second direction DR2 in the light-emitting area EMA. The electrodes RME may be spaced apart from each other in the first direction DR1.

The display device 10 may include a first electrode RME1 and a second electrode RME2 disposed in each sub-pixel SPX. For example, the first electrode RME1 may be disposed at a center of the light-emitting area EMA. The second electrode RME2 may be spaced apart from the first electrode RME1 in the first direction DR1 and may be disposed on left and right sides from the center of the light-emitting area EMA.

The first electrode RME1 may include a first electrode stem RMS1 extending in the first direction DR1 and a first electrode branch RMB1 branching from the first electrode stem RMS1 and extending in the second direction DR2. The first electrode stem RMS1 may extend from a signal application pad, and may terminate in each sub-pixel SPX. The signal application pad may receive power required for alignment of the light-emitting elements ED from the display device 10 or from an external device and may apply the power to the electrodes. The first electrode stem RMS1 of a corresponding sub-pixel may not be connected to a first electrode stem of a neighboring sub-pixel in the first direction DR1. This structure of the first electrode stem RMS1 may be achieved by forming a single connected stem electrode during a manufacturing process, and by disconnecting the single connected stem electrode after an alignment process of the light-emitting elements ED is performed. Accordingly, different signals may be applied to the different first electrode stems RMS1 respectively disposed in different sub-pixels SPX. Thus, the different first electrode stems RMS1 may be individually activated.

The first electrode branch RMB1 may branch from the first electrode stem RMS1 and may extend in the second direction DR2. An end of the first electrode branch RMB1 may be spaced apart, in the first direction DR1, from the second electrode RME2 extending in the first direction DR1. The first electrode branch RMB1 may be electrically connected to the first electrode stem RMS1 terminated in each sub-pixel SPX and may be individually activated. Although the drawing shows that only one first electrode branch RMB1 is disposed in each sub-pixel, the disclosure is not limited thereto. A larger number of the first electrode branches RMB1 may be disposed in each sub-pixel.

The second electrode RME2 may include a second electrode stem RMS2 extending in the first direction DR1, and a first-second electrode branch RMB2 and a second-second electrode branch RMB3 branching from the second electrode stem RMS2 and extending in the second direction DR2. The second electrode stem RMS2 may extend from the signal application pad, but may terminate in each sub-pixel SPX. The signal application pad may receive power required for alignment of the light-emitting elements ED from the display device 10 or from an external device and may apply the power to the electrodes. The second electrode stem RMS2 of a corresponding sub-pixel may not be connected to a second electrode stem of a neighboring sub-pixel in the first direction DR1. This structure of the second electrode stem RMS2 may be achieved by forming a single connected stem electrode during a manufacturing process, and by disconnecting the single connected stem electrode after an alignment process of the light-emitting elements ED is performed. Accordingly, different signals may be applied to different second electrode stems RMS2 respectively disposed in different sub-pixels SPX. Thus, the different second electrode stems RMS2 may be individually activated. However, the disclosure is not limited thereto, and the second electrode stem RMS2 may not be terminated and may be continuous across the sub-pixels.

The first-second electrode branch RMB2 and the second-second electrode branch RMB3 may branch from the second electrode stem RMS2 and extend in the second direction DR2. an end of each of the first-second electrode branch RMB2 and the second-second electrode branch RMB3 may be electrically connected to the second electrode stem RMS2, while another end thereof may be spaced apart from the first electrode stem RMS1. The first-second electrode branch RMB2 and the second-second electrode branch RMB3 may be arranged to be spaced apart from each other in the first direction DR1 while the first electrode branch RMB1 is interposed therebetween.

The above-described first electrode branch RMB1 may be disposed on the second bank pattern BP2 disposed at the center of the light-emitting area EMA. The first-second electrode branch RMB2 may be disposed on the first bank pattern BP1 disposed at the left side from the center of the light-emitting area EMA, and the second-second electrode branch RMB3 may be disposed on the first bank pattern BP1 disposed at the right side from the center of the light-emitting area EMA. The electrodes RME may be disposed at least on the inclined side surface of each of the bank patterns BP1 and BP2. In an embodiment, a width in the first direction DR1 of the first electrode branch RMB1 may be greater than that of the second bank pattern BP2. A width of each of the first-second electrode branch RMB2 and the second-second electrode branch RMB3 in the first direction DR1 may be smaller than that of the first bank pattern BP1. At least partial areas of the electrodes RME may be directly disposed on the via layer VIA and thus may be disposed on the same plane.

The first and second electrodes RME1 and RME2 may be electrically connected to the third conductive layer via first and second electrode contact holes CTD and CTS, respectively. The first electrode RME1 may electrically contact a first conductive pattern CDP1 via the first electrode contact hole CTD extending through the via layer VIA disposed thereunder. The first electrode contact hole CTD may electrically connect the first electrode RME1 with the first conductive pattern CDP1, so that the first power voltage of the first transistor T1 may be applied to the first electrode RME1 through the first conductive pattern CDP1. The first electrode RME1 may be disconnected after the alignment of the light-emitting elements ED as described above, so that a signal may be applied from the first transistor T1 through the first electrode contact hole CTD thereto.

The second electrode RME2 may electrically contact a second voltage line VL2 via the second electrode contact hole CTS extending through the via layer VIA disposed thereunder. The first electrode RME1 may be electrically connected to the first transistor T1 via the first conductive pattern CDP1 such that the first power voltage may be applied thereto. The second electrode RME2 may be electrically connected to the second voltage line VL2 so that the second power voltage may be applied thereto.

The electrodes RME may be electrically connected to the light-emitting element ED. Each of the electrodes RME may be electrically connected to the light-emitting element ED via the connection electrodes CNE: CNE1, CNE2, and CNE3 which will be described later, and may transmit an electrical signal applied from the conductive layer disposed thereunder to the light-emitting element ED.

Each of the electrodes RME may include a conductive material having a high reflectivity. For example, each of the electrodes RME may include a metal such as silver (Ag), copper (Cu), or aluminum (Al) as a material having a high reflectivity or an alloy including aluminum (Al), nickel (Ni), lanthanum (La), and the like. Each of the electrodes may reflect light emitted from the light-emitting element ED and traveled to the side surfaces of the bank patterns BP1 and BP2 to a top of each sub-pixel SPX.

However, the disclosure is not limited thereto. Each of the electrodes RME may include a transparent conductive material. For example, each of the electrodes RME may include a material such as ITO (Indium Tin Oxide), IZO (Indium Zinc Oxide), ITZO (Indium Tin-Zinc Oxide), or the like. In embodiments, each of the electrodes RME may have a structure in which at least one layer made of a transparent conductive material and at least one layer made of a metal having a high reflectivity are stacked each other, or may include a single layer including the transparent conductive material and the metal having high reflectivity described above. For example, each of the electrodes RME may have a stack structure such as ITO/silver (Ag)/ITO, ITO/Ag/IZO, or ITO/Ag/ITZO/IZO.

The bank layer BNL may be disposed on the via layer VIA. The bank layer BNL may be formed in a grid pattern including the portion extending in the first direction DR1 and the portion extending in the second direction DR2 in a plan view. The bank layer BNL may extend along a boundary of each sub-pixel SPX to define neighboring sub-pixels SPX. Further, the bank layer BNL may surround the light-emitting area EMA. The bank layer BNL may surround and define each light-emitting area EMA.

The bank layer BNL may have a certain vertical dimension. In embodiments, a vertical level of a top surface of the bank layer BNL may be higher than that of a top surface of each of the bank patterns BP1 and BP2. A thickness of the bank layer BNL may be equal to or greater than that of each of the bank patterns BP1 and BP2. However, the disclosure is not limited thereto. A vertical level of a top surface of the bank layer BNL may be lower than or equal to that of a top surface of each of the bank patterns BP1 and BP2. A thickness of the bank layer BNL may be smaller than that of each of the bank patterns BP1 and BP2. The bank layer BNL may prevent ink in a sub-pixel SPX overflowing into adjacent sub-pixel SPX in an inkjet printing process during the manufacturing process of the display device 10. The bank layer BNL may prevent different inks containing different light-emitting elements ED dispersed therein in different sub-pixels SPX from being mixed with each other. The bank layer BNL may include polyimide as in each of the bank patterns BP1 and BP2. However, the disclosure is not limited thereto.

The light-emitting elements ED may be disposed on the electrodes RME. The light-emitting element ED may include multiple layers arranged in a direction parallel to a top surface of the substrate SUB. The light-emitting element ED of the display device 10 may be oriented so that the direction in which the light-emitting element extends is parallel to a top surface of the substrate SUB. Multiple semiconductor layers constituting the light-emitting element ED may be sequentially arranged in the direction parallel to the top surface of the substrate SUB. However, the disclosure is not limited thereto. In another embodiment, in case that the light-emitting element ED has a different structure, the layers constituting the light-emitting element ED may be arranged in a direction perpendicular to the top surface of the substrate SUB.

The light-emitting elements ED may be disposed between the bank patterns BP1 and BP2 or on different electrodes RME. Some of the light-emitting elements ED may be disposed between a first bank pattern BP1 and the second bank pattern BP2, while the other thereof may be disposed between another first bank pattern BP1 and the second bank pattern BP2. According to an embodiment, the light-emitting elements ED may include a first light-emitting element ED1 disposed between the first bank pattern BP1 disposed at the right side from the center of the light-emitting area EMA and the second bank pattern BP2, and a second light-emitting element ED2 disposed between the second bank pattern BP2 and the first bank pattern BP1 disposed at the left side from the center of the light-emitting area EMA. The first light-emitting element ED1 may be disposed on the first electrode branch RMB1 and the second-second electrode branch RMB3 of the second electrode RME2, and the second light-emitting element ED2 may be disposed on the first electrode branch RMB1 and the first-second electrode branch RMB2 of the second electrode RME2. The first light-emitting element ED1 may be disposed adjacent to a right side of the light-emitting area EMA of the corresponding sub-pixel SPX. The second light-emitting element ED2 may be disposed adjacent to a left side of the light-emitting area EMA of the corresponding sub-pixel SPX. However, each of the light-emitting elements ED may be identified not based on a position thereof in the light-emitting area EMA, but based on a connection relationship thereof with the connection electrode CNE, which will be described later. Both ends of each of the light-emitting elements ED may respectively electrically contact different connection electrodes CNE depending on an arrangement structure of the connection electrodes CNE. Different light-emitting elements ED may electrically contact different types of connection electrodes CNE.

The light-emitting elements ED may electrically contact and be electrically connected to the connection electrodes CNE1, CNE2, and CNE3. Since a portion of the semiconductor layer at an end surface of the light-emitting element ED in the direction in which the light-emitting element ED extends is exposed, the exposed portion of the semiconductor layer may electrically contact the connection electrode CNE. An end of the first light-emitting element ED1 may electrically contact the first connection electrode CNE1 while another end thereof may electrically contact the second connection electrode CNE2. An end of the second light-emitting element ED2 may electrically contact the first connection electrode CNE1 while another end thereof may electrically contact the third connection electrode CNE3. Each of the light-emitting elements ED may be electrically connected to the conductive layers under the electrode RME and the via layer VIA via the connection electrodes CNE, and thus the electric signal may be applied to the element ED to emit light in a wavelength band.

The first insulating layer PAS1 may be disposed on the light-emitting elements ED. The first insulating layer PAS1 may include a pattern portion which is disposed between the bank patterns BP1 and BP2, extends in the second direction DR2, and is disposed on the light-emitting elements ED. The pattern portion may be disposed to partially surround an outer surface of the light-emitting element ED, and both opposing sides or both opposing ends of the light-emitting element ED may not be covered with the pattern portion. The pattern portion may be formed in a linear or island-shaped pattern in a plan view and may be disposed within each sub-pixel SPX. The pattern portion of the first insulating layer PAS1 may protect the light-emitting elements ED, and at the same time, fix the light-emitting elements ED in the manufacturing process of the display device 10.

The first insulating layer PAS1 may fill a space between the light-emitting element ED and the via layer VIA thereunder. For example, the first insulating layer PAS1 may be formed to cover an entirety of each of the light-emitting elements ED, and patterned such that both opposing ends of each of the light-emitting elements ED may be exposed. The first insulating layer PAS1 may have a portion which fill the space between each of the emitting elements ED and the via layer VIA thereunder. A portion of the first insulating layer PAS1 may be disposed on the bank layer BNL.

The connection electrodes CNE1, CNE2, and CNE3 may include the first connection electrode CNE1, the second connection electrode CNE2, and the third connection electrode CNE3. Each of the first connection electrode CNE1, the second connection electrode CNE2, and the third connection electrode CNE3 may have a shape extending in the second direction DR2. The first connection electrode CNE1, the second connection electrode CNE2, and the third connection electrode CNE3 may be arranged to be spaced apart from each other in the first direction DR1. The second connection electrode CNE2 and the third connection electrode CNE3 may be disposed adjacent to each other and the first connection electrode CNE1 may be interposed therebetween. The first connection electrode CNE1, the second connection electrode CNE2, and the third connection electrode CNE3 may extend in parallel to each other and may be disposed in the light-emitting area EMA. The first connection electrode CNE1, the second connection electrode CNE2, and the third connection electrode CNE3 may electrically contact an end of the light-emitting element ED, and may electrically contact the first electrode RME1 or the second electrode RME2 and thus may receive an electrical signal therefrom.

The first connection electrode CNE1 may have a shape extending in the second direction DR2 and may be disposed on the first electrode branch RMB1 of the first electrode RME1. A portion of the first connection electrode CNE1 disposed on the second bank pattern BP2 may directly contact the first electrode RME1 and overlap the first electrode branch RMB1 of the first electrode RME1. The first connection electrode CNE1 may receive an electrical signal applied from the first transistor T1 via the first electrode RME1. The first connection electrode CNE1 may directly contact an end of the first light-emitting element ED1 and an end of the second light-emitting element ED2.

The second connection electrode CNE2 may have a shape extending in the second direction DR2 and may be disposed on the second-second electrode branch RMB3 of the second electrode RME2. A portion of the second connection electrode CNE2 disposed on the first bank pattern BP1 may directly contact the second electrode RME2 and overlap the second-second electrode branch RMB3 of the second electrode RME2. The second connection electrode CNE2 may receive an electrical signal applied from the second voltage line VL2 via the second electrode RME2. The second connection electrode CNE2 may directly contact another end of the first light-emitting element ED1.

The third connection electrode CNE3 may have a shape extending in the second direction DR2 and may be disposed on the first-second electrode branch RMB2 of the second electrode RME2. A portion of the third connection electrode CNE3 disposed on the first bank pattern BP1 may directly contact the second electrode RME2 and overlap the first-second electrode branch RMB2 of the second electrode RME2. The third connection electrode CNE3 may receive an electrical signal applied from the second voltage line VL2 via the second electrode RME2. The third connection electrode CNE3 may directly contact another end of the second light-emitting element ED2.

The second insulating layer PAS2 may be disposed on the first connection electrode CNE1 and the first insulating layer PAS1. The second insulating layer PAS2 may be disposed to cover the first connection electrode CNE1 so as to electrically insulate the first connection electrode CNE1 from the second connection electrode CNE2 and the third connection electrode CNE3 adjacent thereto. The second connection electrode CNE2 and the third connection electrode CNE3 may be disposed on the second insulating layer PAS2.

Although not shown in the drawing, an additional insulating layer may be disposed on the second insulating layer PAS2, the second connection electrode CNE2, and the third connection electrode CNE3. The additional insulating layer may protect the members disposed on the substrate SUB from an external environment. Each of the first insulating layer PAS1 and the second insulating layer PAS2 as described above may include an inorganic insulating material or an organic insulating material.

Figure 6:
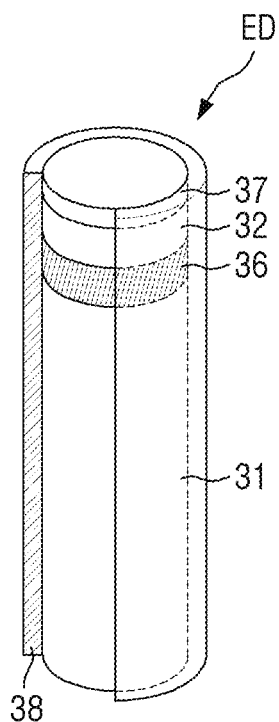
FIG. 6 is a perspective view showing a light-emitting element according to an embodiment.
Figure 7:
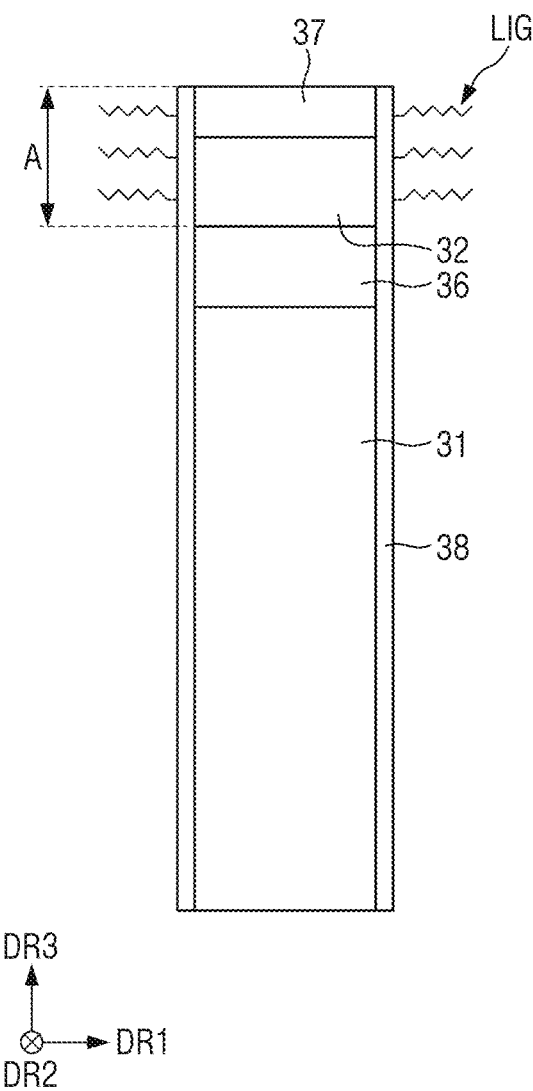
FIG. 7 is a schematic cross-sectional view showing a light-emitting element according to an embodiment.
Figure 8:
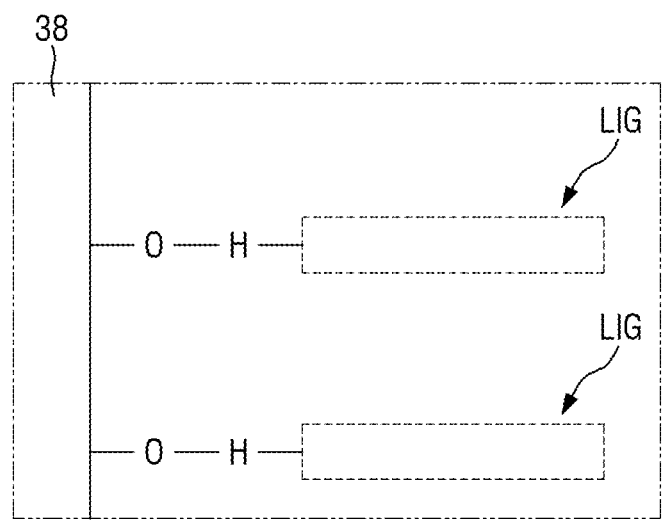
FIG. 8 is an enlarged schematic cross-sectional view of a portion of a light-emitting element according to an embodiment.

FIG. 6 is a perspective view showing a light-emitting element according to an embodiment. FIG. 7 is a schematic cross-sectional view showing a light-emitting element according to an embodiment. FIG. 8 is an enlarged schematic cross-sectional view of a portion of a light-emitting element according to an embodiment.

Referring to FIG. 6 to FIG. 8, the light-emitting element ED according to an embodiment may be embodied as a light-emitting diode. For example, the light-emitting element ED may be embodied as an inorganic light-emitting diode including an inorganic material and having a size of nano-meter to micro-meter. The light-emitting elements ED may be arranged between the two electrodes facing each other. In case that an electric field is generated between the two electrodes in a direction, the light-emitting elements ED may be aligned in parallel to the direction.

The light-emitting element ED according to an embodiment may have a shape extending in a direction. The light-emitting element ED may have a shape such as a cylinder, a rod, a wire, or a tube. However, the shape of the light-emitting element ED is not limited thereto. The light-emitting element ED may have a variety of shapes. In another embodiment, the light-emitting element ED may have a shape of a polygonal prism such as a cube, a cuboid, or a hexagonal prism. In still another embodiment, the light-emitting element ED may extend in a direction and have a partially inclined outer surface.

The light-emitting element ED may include a semiconductor layer doped with a conductive type, for example, p-type or n-type impurities. The semiconductor layer may receive an electrical signal applied from an external power source and may emit light of a wavelength band. The light-emitting element ED may include a first semiconductor layer 31, a second semiconductor layer 32, a light-emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may include AlGaInN, GaN, AlGaN, InGaN, AlN, InN, or a combination thereof and may be doped with a n-type dopant. The n-type dopant doped into the first semiconductor layer 31 may be Si, Ge, Sn, or the like.

The second semiconductor layer 32 may be disposed on the first semiconductor layer 31 while the light-emitting layer 36 is interposed therebetween. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may include AlGaInN, GaN, AlGaN, InGaN, AlN, InN, or a combination thereof and may be doped with a p-type dopant. The p-type dopant doped into the second semiconductor layer 32 may be Mg, Zn, Ca, Se, Ba, or the like.

The drawing shows that each of the first semiconductor layer 31 and the second semiconductor layer 32 is composed of a single layer. However, the disclosure is not limited thereto. Depending on a material of the light-emitting layer 36, each of the first semiconductor layer 31 and the second semiconductor layer 32 may include a larger number of layers, for example, a cladding layer or a TSBR (tensile strain barrier reducing) layer.

The light-emitting layer 36 may be disposed between the first semiconductor layer 31 and the second semiconductor layer 32. The light-emitting layer 36 may include a material of a single or multiple quantum well structure. In case that the light-emitting layer 36 includes a material of the multiple quantum well structure, the light-emitting layer 36 may have a structure in which quantum layers and well layers are alternately stacked with each other. The light-emitting layer 36 may emit light via combinations of electrons and holes in response to an electrical signal applied through the first semiconductor layer 31 and the second semiconductor layer 32. The light-emitting layer 36 may include a material such as AlGaN and AlGaInN. For example, in case that the light-emitting layer 36 has a structure in which quantum layers and well layers are alternately stacked with each other, the quantum layer may include a material such as AlGaN or AlGaInN, and the well layer may include a material such as GaN or AlInN.

The light-emitting layer 36 may have a structure in which first layers made of a semiconductor material having a larger bandgap energy and second layers made of a semiconductor material having a smaller bandgap energy are alternately stacked with each other. The light-emitting layer 36 may include group III to group V semiconductor materials depending on a wavelength band of emitting light. The light emitting from the light-emitting layer 36 is not limited to light of a wavelength band corresponding to a blue color. In embodiments, the light emitting from the light-emitting layer 36 may be light of a wavelength band corresponding to a red or green color.

The electrode layer 37 may be an ohmic connection electrode. However, the disclosure is not limited thereto. The electrode layer 37 may be a Schottky connection electrode. The light-emitting element ED may include at least one electrode layer 37. However, the disclosure is not limited thereto. The electrode layer 37 may be omitted.

The electrode layer 37 may reduce an electrical resistance between the light-emitting element ED and the electrode or the connection electrode in case that the light-emitting element ED is electrically connected to the electrode or the connection electrode in the display device 10. The electrode layer 37 may include a conductive metal. For example, the electrode layer 37 may include aluminum (Al), titanium (Ti), indium (In), gold (Au), silver, (Ag), ITO, IZO, ITZO, or a combination thereof.

The insulating film 38 may be disposed to surround an outer surface of each of the semiconductor layers 31 and 32, the light-emitting layer 36, and the electrode layer 37. For example, the insulating film 38 may be disposed to surround at least an outer surface of the light-emitting layer 36 such that both opposing ends in a longitudinal direction of the light-emitting element ED may be exposed. The insulating film 38 may be formed in an area adjacent to at least one end of the light-emitting element ED having a rounded top surface in a cross-sectional view.

The insulating film 38 may include a material having an insulating ability, for example, silicon oxide ($SiO_x$), silicon nitride ($SiN_x$), silicon oxynitride ($SiO_xN_y$), aluminum nitride ($AlN_x$), aluminum oxide ($AlO_x$), and the like. The drawing illustrates that the insulating film 38 is formed as a single layer. However, the disclosure is not limited thereto. In embodiments, the insulating film 38 may be embodied as a multiple layer structure in which layers are stacked each other.

The insulating film 38 may perform the function of protecting the members. The insulating film 38 may prevent an electrical short circuit that may otherwise occur in the light-emitting layer 36 in case that the light-emitting element ED directly contacts the electrode to which the electrical signal is transmitted. The insulating film 38 may prevent deterioration of the luminous efficiency of the light-emitting element ED.

An outer surface of the insulating film 38 may be surface-treated. The light-emitting elements ED may be sprayed onto the electrode while being dispersed in an ink and may be aligned. In this process, in order to prevent adjacent light-emitting elements ED from being aggregated with each other and to keep the light-emitting elements ED in a dispersed state in the ink, a surface of the insulating film 38 may be treated to have hydrophobicity or hydrophilicity.

The light-emitting element ED according to an embodiment may include an organic ligand LIG bonded to at least a portion of a circumferential surface thereof. The organic ligand LIG may have a polarity and may allow the light-emitting element ED to have a polarity.

According to an embodiment, the organic ligand LIG may include an organic ligand having a positive polarity or an organic ligand having a negative polarity. The organic ligand having a positive polarity may include, for example, n-octyl mercaptan, PEG-$NH_2$, and oleylamine. The organic ligand having a negative polarity may include, for example, oleic acid or PEG-COOH. The light-emitting element ED may include at least one of the organic ligands LIG as described above. For example, the light-emitting element ED may include an organic ligand with a positive polarity, or an organic ligand with a negative polarity.

In an embodiment, the organic ligand LIG may be disposed on a surface of the insulating film 38, which is the circumferential surface of the light-emitting element ED. For example, an organic ligand LIG having a negative polarity may be disposed in an area A of the insulating film 38 corresponding to the second semiconductor layer 32 and the electrode layer 37 of the light-emitting element ED. For example, the organic ligand LIG may be disposed on a portion of the surface of the insulating film 38 overlapping the second semiconductor layer 32 and the electrode layer 37 in a radial direction. For example, the organic ligand LIG may be positionally biased toward an end of the light-emitting element ED, so that the alignment of the light-emitting elements ED may be facilitated in an alignment process of the light-emitting elements ED which will be described later. In another embodiment, an organic ligand LIG having a positive polarity may be disposed in an area A of the insulating film 38 corresponding to the first semiconductor layer 31 of the light-emitting element ED. For example, organic ligand LIG may be disposed on a portion of the surface of the insulating film 38 overlapping the first semiconductor layer 31 in a radial direction. A description thereof will be made later.

As shown in FIG. 8, the above-described organic ligand LIG may bond to the insulating film 38 of the light-emitting element ED. In embodiments, the insulating film 38 may include the above-described oxides. The outermost electron of an oxygen (O) atom of the oxide constituting the insulating film 38 and an electron of hydrogen (H) of the organic ligand LIG may covalently bond to each other. Accordingly, the end of the light-emitting element ED may be polarized due to the polarity of the organic ligand LIG. In order to align the light-emitting elements ED, direct current (DC) voltage may be applied to the electrodes to generate an electric field between the electrodes. The light-emitting element ED may be oriented such that the end thereof polarized due to the polarity of the organic ligand LIG is disposed on an electrode having an opposite polarity, while another end of the light-emitting element ED on which the organic ligand LIG is not disposed is disposed on another electrode. Thus, the alignment of the light-emitting elements ED may be facilitated.

Hereinafter, a method for manufacturing a display device according to an embodiment as described above will be described.

Figure 17:
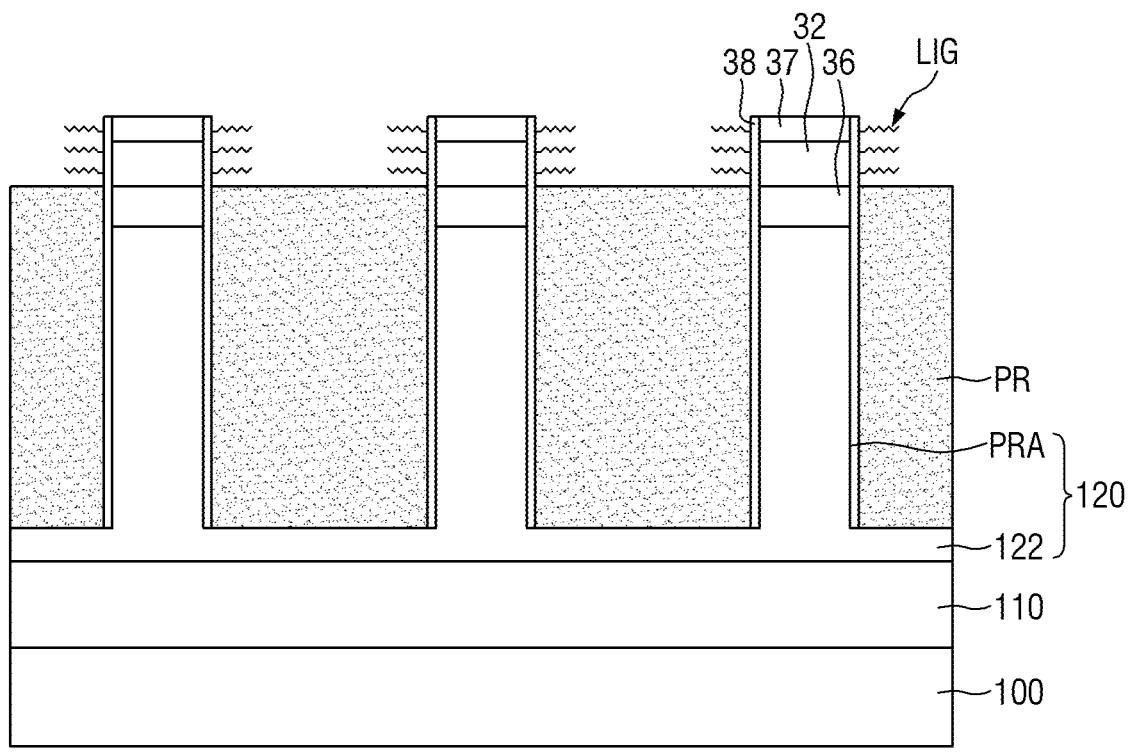
Figure 18:
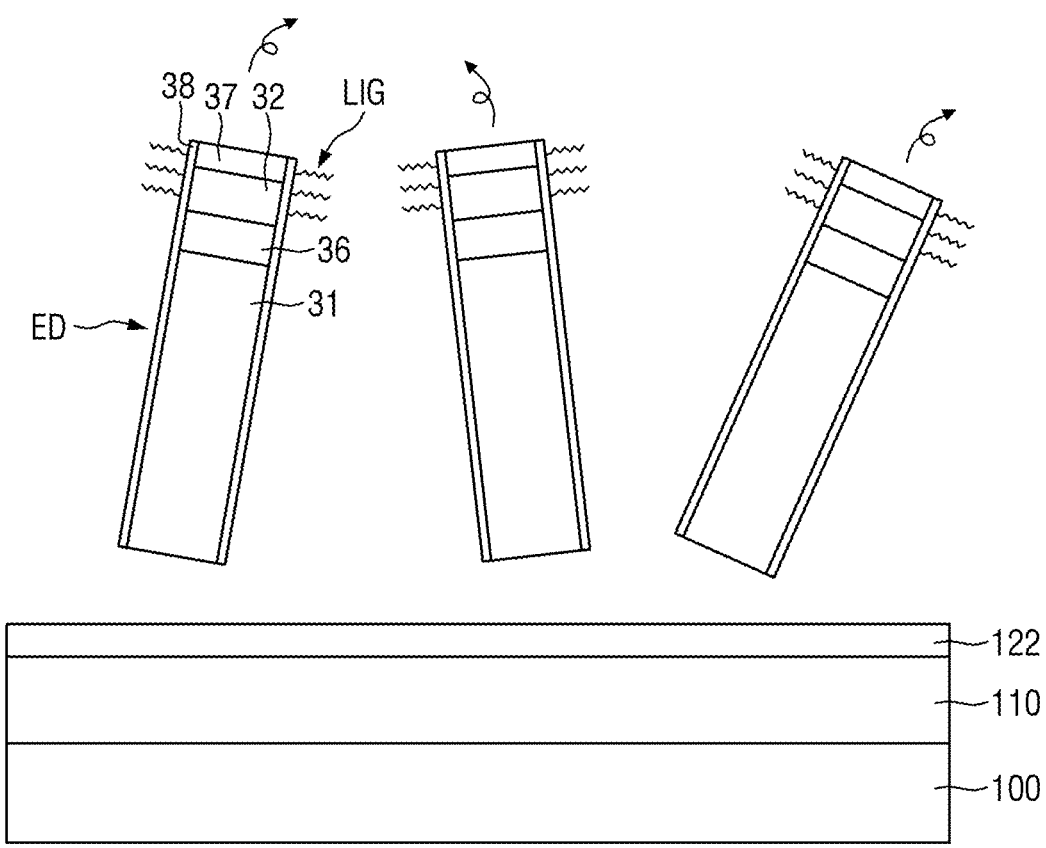
Figure 19:
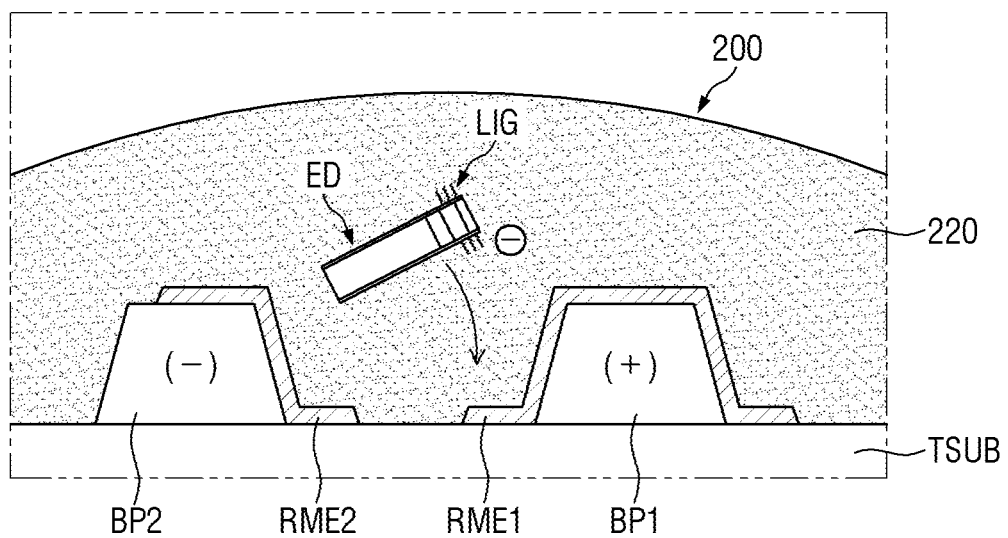
Figure 20:
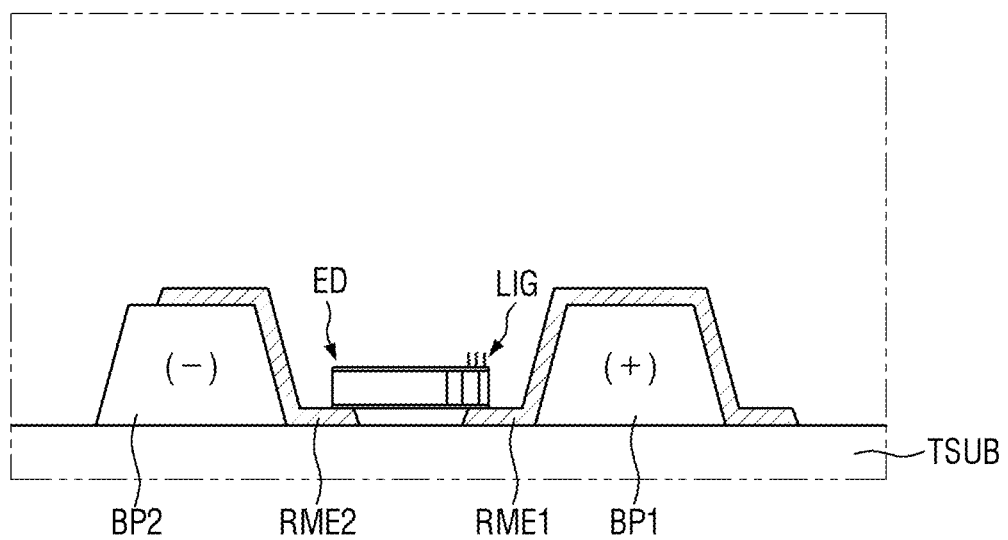

FIGS. 9 to 20 are each a schematic diagram illustrating steps of a method for manufacturing a display device according to an embodiment. FIG. 9 to FIG. 18 show schematic diagrams illustrating steps of a method for manufacturing a light-emitting element, and FIG. 19 and FIG. 20 show a method for aligning the manufactured light-emitting elements.

Figure 9:
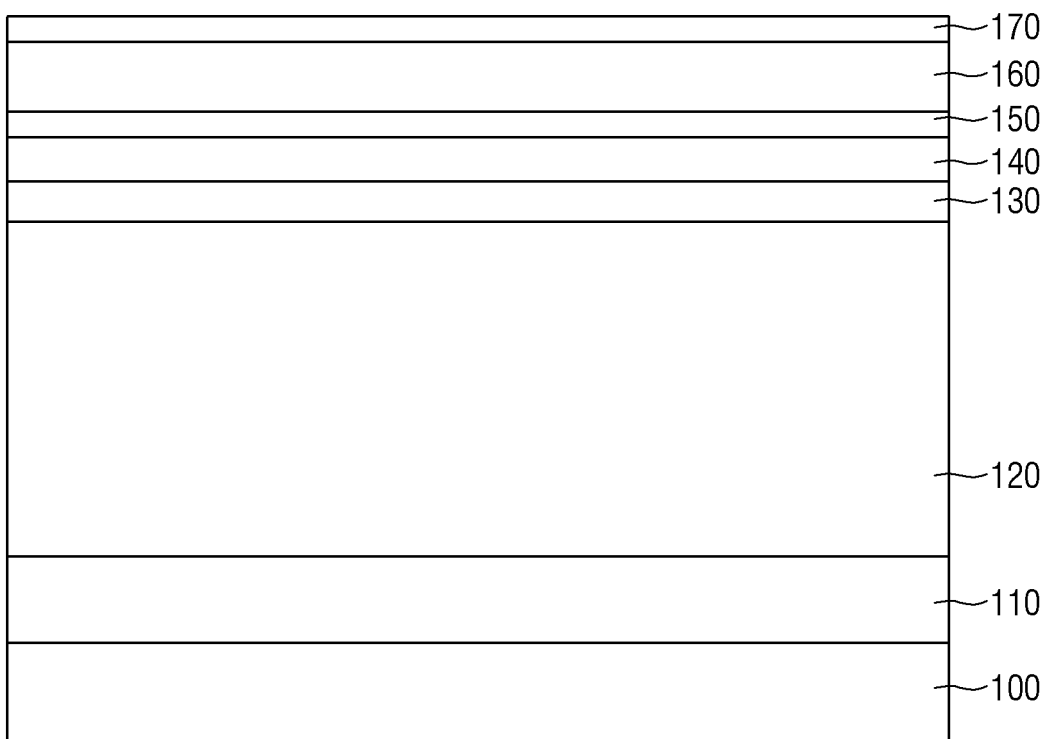
FIG. 9 to FIG. 20 are each a schematic diagram showing steps of a method for manufacturing a display device according to an embodiment.

Referring to FIG. 9, the method may include preparing a base substrate 100. The base substrate 100 may be a sapphire substrate ($Al_2O_3$) or a transparent substrate including such as glass. However, the disclosure is not limited thereto. The base substate may be embodied as a conductive substrate including, for example, GaN, SiC, ZnO, Si, GaP, GaAs, or a combination thereof. Hereinafter, an embodiment in which the base substrate 100 is a sapphire substrate made of $Al_2O_3$ is described. A thickness of the base substrate 100 is not particularly limited. In an embodiment, the base substrate 100 may have a thickness in a range of about 400 μm to about 1500 μm.

A buffer layer 110 may be formed on the base substrate 100. Although the drawing shows that the buffer layer 110 is a single layer, the disclosure is not limited thereto. The buffer layer may include multiple layers. The buffer layer 110 may be disposed to reduce a difference between lattice constants of a first semiconductor material layer 120 which will be described later and the base substrate 100.

For example, the buffer layer 110 may include an undoped semiconductor or may include substantially the same material as that of the first semiconductor material layer, but may be not doped with n-type or p-type impurities. In embodiments, the buffer layer 110 may include undoped InAlGaN, GaN, AlGaN, InGaN, AlN, InN, or a combination thereof. However, the disclosure is not limited thereto. The buffer layer 110 may be omitted depending on the base substrate 100. Hereinafter, a case in which the buffer layer 110 including the undoped semiconductor is formed on the base substrate 100 will be described.

The first semiconductor material layer 120, a light-emitting material layer 130, a second semiconductor material layer 140, and an electrode material layer 150 may be formed on the buffer layer 110. The first semiconductor material layer 120, the light-emitting material layer 130 disposed on the first semiconductor material layer 120, and the second semiconductor material layer 140 disposed on the light-emitting material layer 130 may be formed in an epitaxial manner. For example, the first semiconductor material layer 120, the light-emitting material layer 130 disposed on the first semiconductor material layer 120, and the second semiconductor material layer 140 disposed on the light-emitting material layer 130 may be formed using, for example, electron beam deposition, physical vapor deposition (PVD), chemical vapor deposition (CVD), plasma laser deposition (PLD), dual-type thermal evaporation, sputtering, or metal organic chemical vapor deposition (MOCVD), etc. The metal-organic chemical vapor deposition (MOCVD) may be employed. However, the disclosure is not limited thereto.

A precursor material for producing each of the first semiconductor material layer 120, the light-emitting material layer 130, and the second semiconductor material layer 140 is not particularly limited, and may be selected from a conventional range in which a target material may be produced. For example, the precursor material may be a metal precursor containing an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$). However, the disclosure is not limited thereto.

The first semiconductor material layer 120, the light-emitting material layer 130, the second semiconductor material layer 140, and the electrode material layer 150 may correspond to respective layers included in the light-emitting element ED according to an embodiment. For example, the first semiconductor material layer 120, the light-emitting material layer 130, the second semiconductor material layer 140, and the electrode material layer 150 may correspond to and include the same materials as those of the first semiconductor layer 31, the light-emitting layer 36, the second semiconductor layer 32, and the electrode layer 37 of the light-emitting element ED, respectively.

A first mask layer 160 and a second mask layer 170 may be formed on the electrode material layer 150. The first mask layer 160 and the second mask layer 170 may be hard masks for patterning the first semiconductor material layer 120, the light-emitting material layer 130, the second semiconductor material layer 140, and the electrode material layer 150. In embodiments, the first mask layer 160 may include an insulating material, for example, a silicon oxide. The second mask layer 170 may include a metal material, for example, aluminum (Al).

Figure 10:
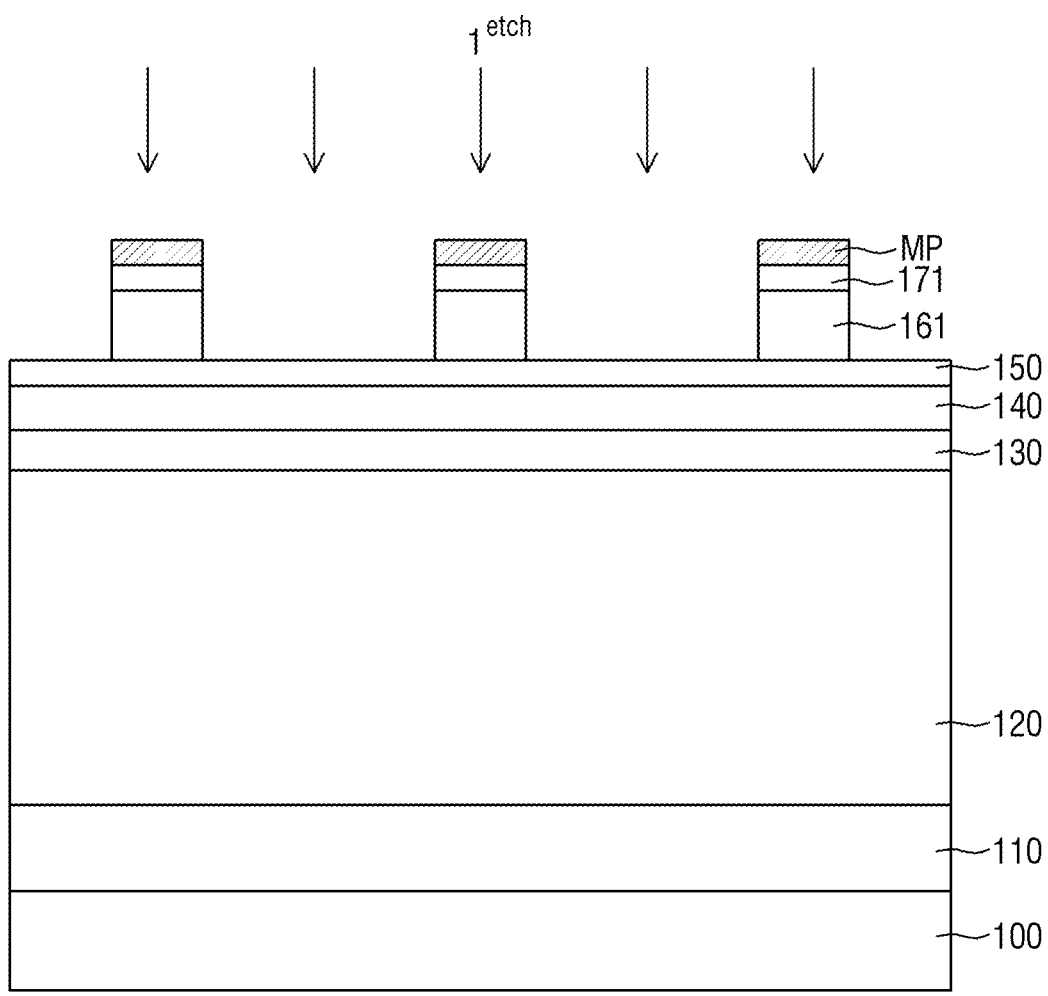

Referring to FIG. 10, a mask pattern MP may be formed on the second mask layer 170. The mask pattern MP may be formed by coating a photoresist and exposing and developing the photoresist. The mask pattern MP may have a circular planar shape in a plan view. However, the disclosure is not limited thereto. The shape of the mask pattern MP in a plan view may vary depending on a shape of the light-emitting element.

A first pattern 161 and a second pattern 171 may be formed by first etching $1^{etch}$ the first mask layer 160 and the second mask layer 170 using the mask pattern MP. The first pattern 161 may be formed by etching the first mask layer 160. The second pattern 171 may be formed by etching the second mask layer 170. The first etching $1^{etch}$ may employ dry etching. The mask pattern MP may be removed.

Figure 11:
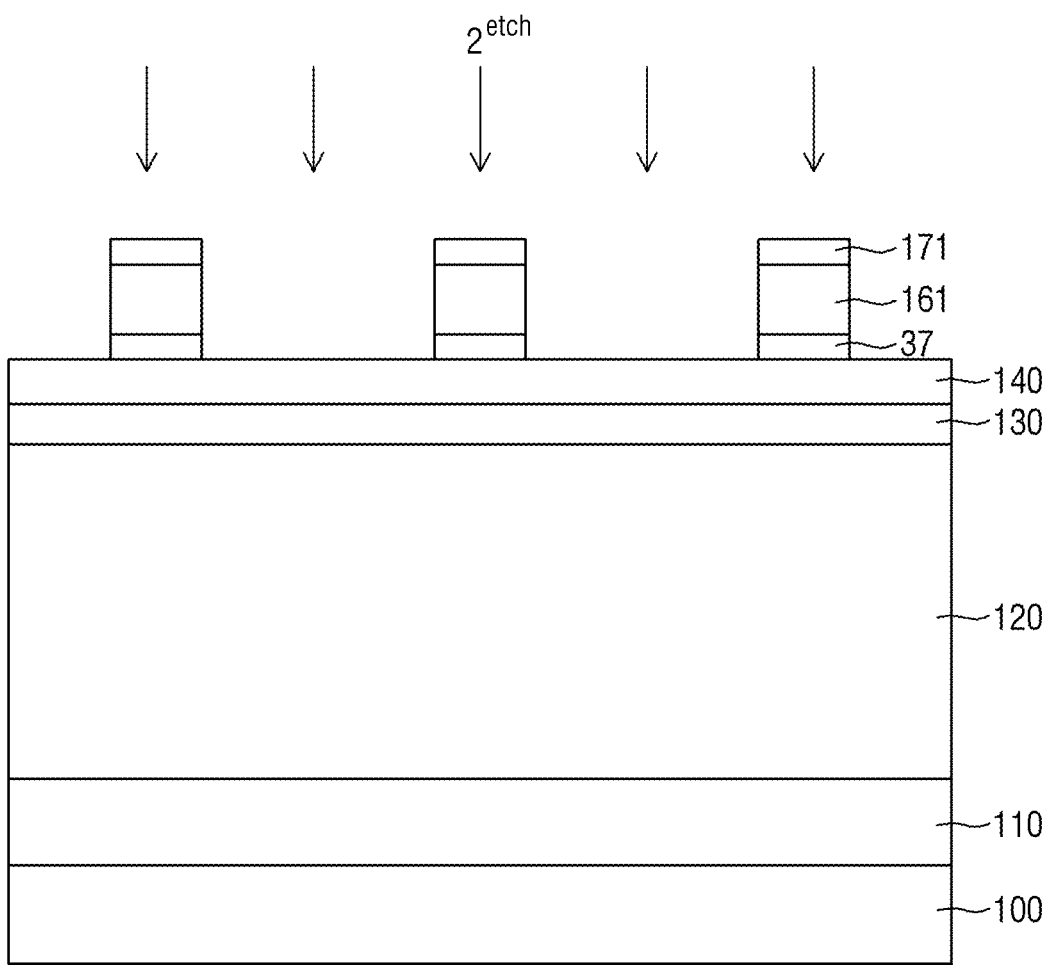

Referring to FIG. 11, second etching $2^{etch}$ of the electrode material layer 150 may be performed using the first pattern 161 and the second pattern 171 as a mask to form the electrode layer 37. The electrode layer 37 may have a same planar shape as that of the light-emitting element ED and may constitute an end of the light-emitting element ED to be described later. The second etching $2^{etch}$ may employ dry etching. The first pattern 161 and the second pattern 171 may be removed.

Figure 12:
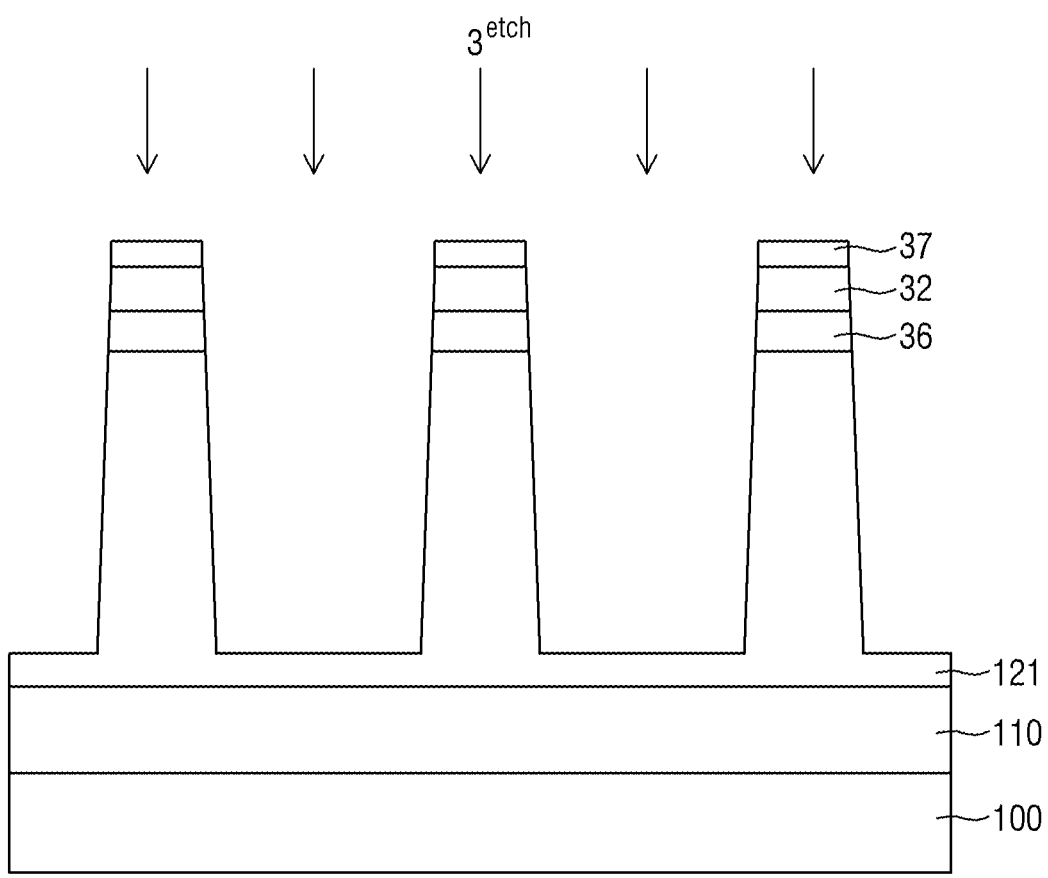

Referring to FIG. 12, the first semiconductor material layer 120, the light-emitting material layer 130, and the second semiconductor material layer 140 may be third etched using the electrode layer 37 as a mask ($3^{etch}$). The first semiconductor material layer 120, the light-emitting material layer 130, and the second semiconductor material layer 140 may be etched using a conventional method. For example, the first semiconductor material layer 120, the light-emitting material layer 130, and the second semiconductor material layer 140 may be etched along the electrode layer 37 and in a direction perpendicular to the base substrate 100 disposed thereunder.

For example, a process of etching the first semiconductor material layer 120, the light-emitting material layer 130, and the second semiconductor material layer 140 may employ dry etching, wet etching, reactive ion etching (RIE), inductively coupled plasma reactive ion etching (ICP-RIE), etc. In case of using the dry etching, anisotropic etching may be available. The drying etching may be suitable for vertical etching. In case of using the above-described etching scheme, etchant may include $Cl_2$ or $O_2$. However, the disclosure is not limited thereto.

In the embodiment, in the third etching $3^{etch}$, etching in a depth direction may be first performed in a dry etching manner.

In the process of etching the first semiconductor material layer 120, the light-emitting material layer 130, and the second semiconductor material layer 140, a portion of the first semiconductor material layer 120 as a lower layer may be not etched. Accordingly, the second semiconductor layer 32 may be formed by etching the second semiconductor material layer 140 under the electrode layer 37. The light-emitting layer 36 may be formed by etching the light-emitting material layer 130 under the second semiconductor layer 32. The first semiconductor material layer 120 may be formed to include a base layer 122 adjacent to the buffer layer 110 and protrusions PRA protruding from the base layer 122 in a direction perpendicular to the base substrate 100. The protrusions PRA may be formed into the first semiconductor layer of the light-emitting element ED as will be described later.

Figure 13:
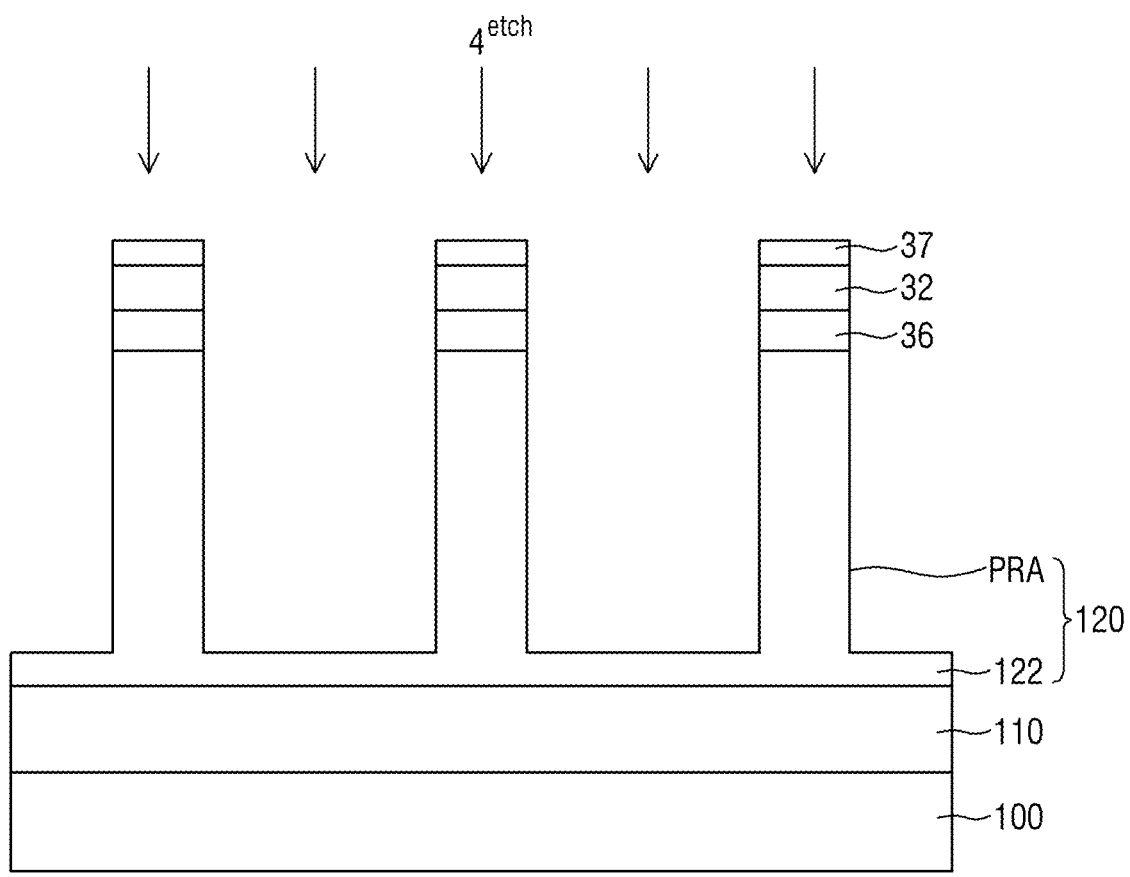

Referring to FIG. 13, fourth etching $4^{etch}$ may be performed on the protrusion PRA of the first semiconductor material layer 120, the light-emitting layer 36, and the second semiconductor layer 32. In the fourth etching $4^{etch}$, a sidewall resulting from isotropic wet etching may formed to be perpendicular to a top surface of the base layer 122. Accordingly, sidewalls of the protrusion PRA of the first semiconductor material layer 120, the light-emitting layer 36, and the second semiconductor layer 32 may be perpendicular to the surface of the base layer.

Figure 14:
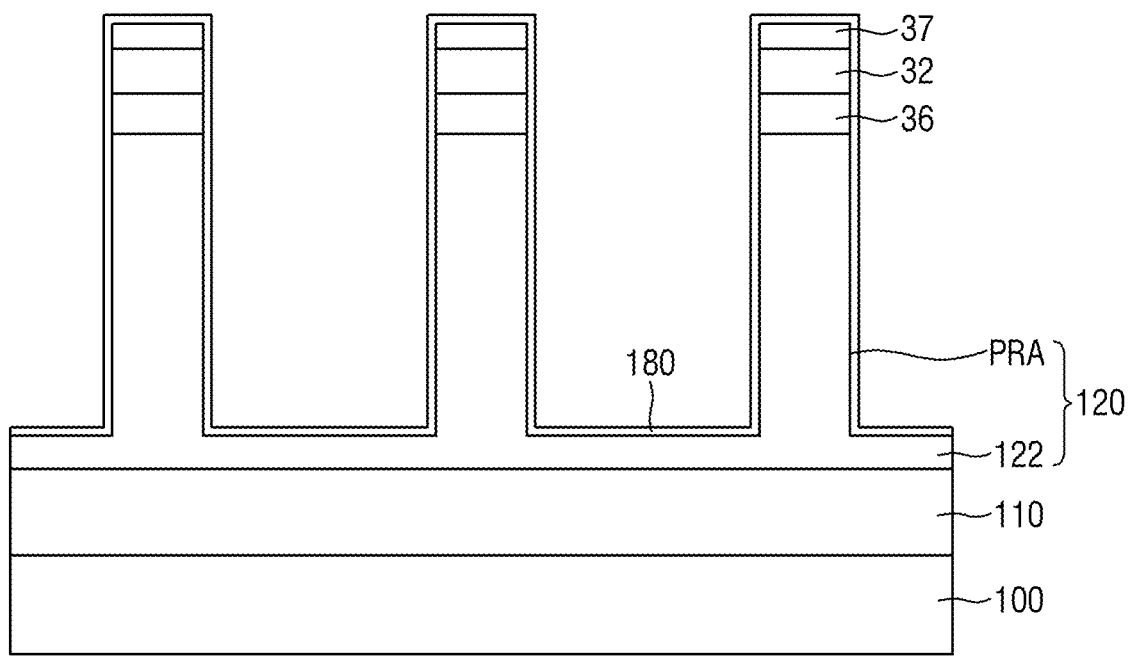

Referring to FIG. 14, an insulating material layer 180 may be formed on the first semiconductor material layer 120, the light-emitting layer 36, the second semiconductor layer 32, and the electrode layer 37. The insulating material layer 180 may be partially etched in a subsequent process to form the insulating film 38 of the light-emitting element ED. The insulating material layer 180 may be disposed to surround outer surfaces of the first semiconductor material layer 120, the light-emitting layer 36, the second semiconductor layer 32, and the electrode layer 37.

The insulating material layer 180 may be formed by applying or immersing an insulating material on the vertically etched outer surfaces of the first semiconductor material layer 120, the light-emitting layer 36, the second semiconductor layer 32, and the electrode layer 37. However, the disclosure is not limited thereto. In embodiments, the insulating material layer 180 may be formed using atomic layer deposition (ALD). The insulating material layer 180 may include silicon oxide ($SiO_x$), silicon nitride ($SiN_x$), silicon oxynitride ($SiO_xN_y$), aluminum oxide ($Al_2O_3$), aluminum nitride (AlN), or a combination thereof.

Figure 15:
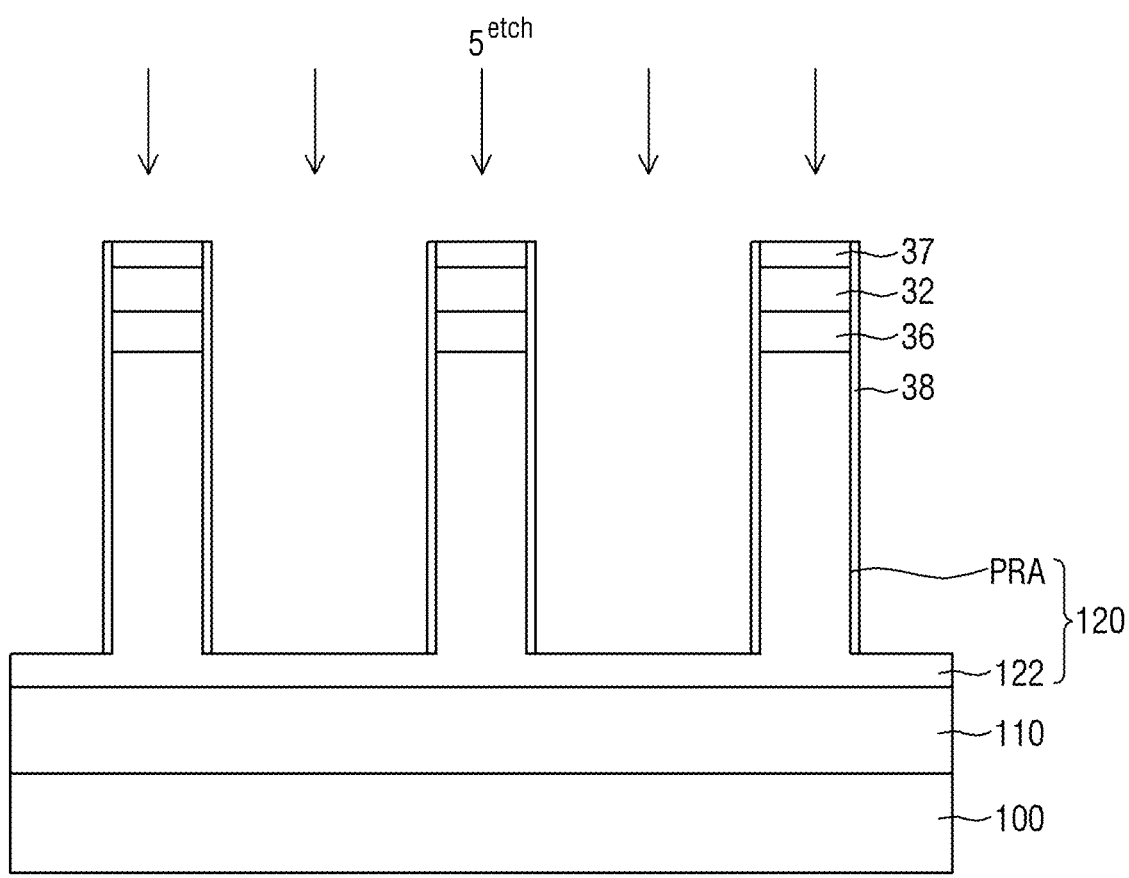

Referring to FIG. 15, the insulating material layer 180 may be fifth etched ($5^{etch}$) to form the insulating film 38. A process of etching the insulating material layer 180 may be performed over an entire top surface of the base substrate 100. The etching process to partially remove the insulating material layer 180 may employ etch-back or dry etching as anisotropic etching. In this etching process, the insulating material layer 180 may be partially removed, and a portion of a top surface of electrode layer 37 may be exposed. Thus, the insulating material layer 180 may be formed to be the insulating film 38.

Figure 16:
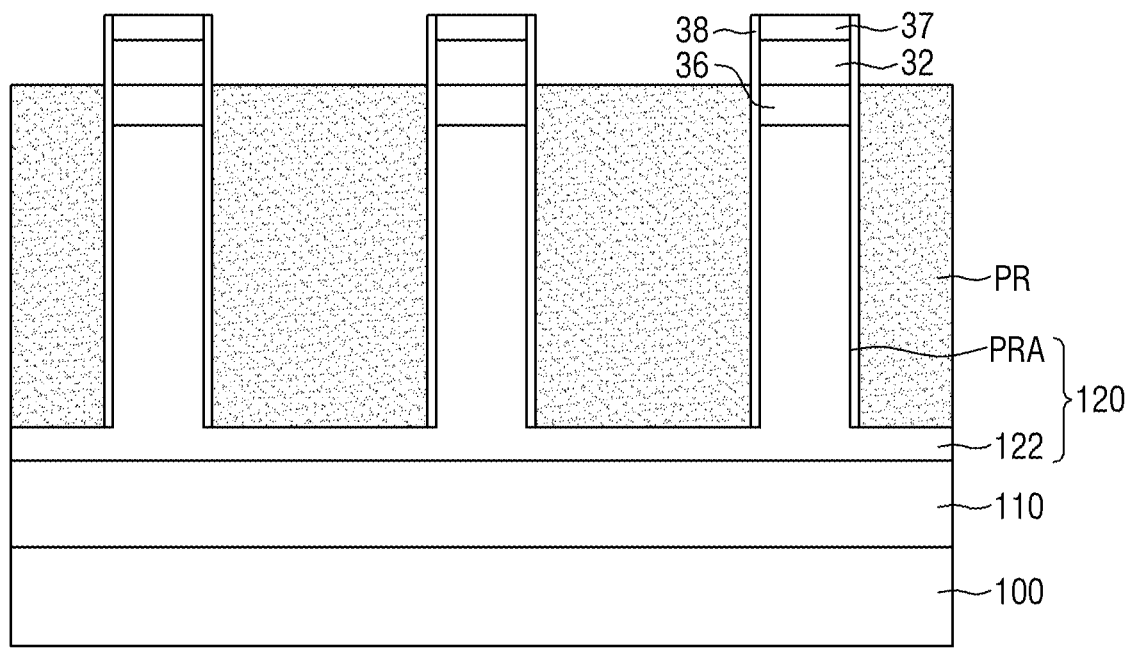

Referring to FIG. 16, a photoresist PR may be coated on the base layer 122 of the first semiconductor material layer 120. The photoresist PR may be formed on the base layer 122 of the first semiconductor material layer 120, and may have a thickness such that a top surface thereof is coplanar with a top surface of the light-emitting layer 36. For example, the photoresist PR may be formed such that the second semiconductor layer 32 and the electrode layer 37 are exposed and a portion of the insulating film 38 corresponding to the second semiconductor layer 32 and the electrode layer 37 is exposed.

Referring to FIG. 17, the base substrate 100 may be immersed in a solution containing the organic ligand LIG therein. The organic ligand LIG may be bonded to an exposed surface of the insulating film 38 where the photoresist PR is not coated. The organic ligand LIG may be an organic ligand LIG with a negative polarity. In embodiments, in case that the insulating film 38 is made of a metal oxide, for example, aluminum oxide, an electron of a hydrogen atom of the organic ligand LIG and the outermost electron of an oxygen atom of the aluminum oxide may react with each other to create a covalent bond. Therefore, the organic ligand LIG having the negative polarity may be bonded to the surface of the insulating film 38, for example, to a portion of the surface of the insulating film 38 corresponding to the second semiconductor layer 32 and the electrode layer 37. After the bonding of the organic ligand LIG thereto has been completed, the photoresist PR may be stripped and removed.

Referring to FIG. 18, the protrusions PRA of the first semiconductor material layer 120 may be separated from the base layer 122 of the first semiconductor material layer 120. The light-emitting elements ED may be separated from the base substrate 100. Accordingly, each of the light-emitting elements ED may include the first semiconductor layer 31, the light-emitting layer 36, the second semiconductor layer 32, the electrode layer 37, and the insulating film 38 surrounding the circumferential surfaces thereof. In an embodiment, the organic ligand LIG having the negative polarity may be bonded to a portion of the surface of the insulating film 38 corresponding to the second semiconductor layer 32 and the electrode layer 37.

Referring to FIG. 19 and FIG. 20, light-emitting element ink 200 containing the light-emitting elements ED and light-emitting element solvent 220 is provided. A target substrate TSUB on which the first bank pattern BP1, the second bank pattern BP2, the first electrode RME1, and the second electrode RME2 have been formed is provided. Although the drawing shows that a pair of electrodes are disposed on the target substrate TSUB, a larger number of electrode pairs may be disposed on the target substrate TSUB. In an embodiment, the target substrate TSUB may include the substrate SUB of the display device 10 as described above and multiple circuit elements disposed on the substrate SUB. Hereinafter, for convenience of description, circuit elements are omitted in the drawings.

The light-emitting element ink 200 may contain the light-emitting element solvent 220, and the light-emitting elements ED dispersed therein. The light-emitting element ink 200 may be prepared using a dispersing process in which the light-emitting elements ED and the light-emitting element solvent 220 are mixed with each other. The dispersing process may be performed by mixing the light-emitting elements ED with the light-emitting element solvent 220, and stirring the mixture for 5 minutes or more. The light-emitting elements ED may be contained in a ratio of 0.01 to 10 parts by weight based on 100 parts by weight of the light-emitting element ink 200. The mixing process may include a sonication process, a stirring process, a milling process, and the like.

The light-emitting element ink 200 may be sprayed on the first electrode RME1 and the second electrode RME2 on the target substrate TSUB. In an embodiment, the light-emitting element ink 200 may be sprayed in a printing process using an inkjet printing apparatus. The light-emitting element ink 200 may be sprayed through a nozzle of an inkjet head included in the inkjet printing apparatus. The light-emitting element ink 200 may be discharged on the target substrate TSUB through the nozzle provided in the inkjet head. The light-emitting element ink 200 discharged from the nozzle may be seated on the first electrode RME1 and the second electrode RME2 disposed on the target substrate TSUB. The light-emitting element ED may have a shape extending in a direction. The light-emitting elements ED may be dispersed in the light-emitting element ink 200 with a random orientation.

An alignment signal may be applied to the first electrode RME1 and the second electrode RME2 to align the light-emitting element ED. For example, direct current (DC) power may be applied to the first electrode RME1 and the second electrode RME2. In embodiments, direct current power may be applied thereto so that the first electrode RME1 has positive polarity and the second electrode RME2 has negative polarity. As described above, the light-emitting element ED may have a negative polarity at an end thereof depending on the polarity of the organic ligand LIG. The end of the light-emitting element ED having the negative polarity may move toward the first electrode RME1 having the positive polarity under an electric field, and may directly contact the first electrode RME1. Another end of the light-emitting element ED on which the organic ligand LIG is not disposed may be disposed on the second electrode RME2 opposite to the first electrode RME1 and may directly contact the second electrode RME2. Consequently, the light-emitting element ED may be aligned such that an end of the light-emitting element ED may be disposed on the first electrode RME1 and another end of the light-emitting element ED may be disposed on the second electrode RME2.

After the light-emitting element ED has been aligned, heat may be irradiated to the light-emitting element ink 200 to remove the solvent 220. The removal process of the light-emitting element solvent 220 may be performed in a chamber capable of controlling an internal pressure thereof. According to an embodiment, the removal process of the light-emitting element solvent 220 may be performed at a pressure of about $10^{-4}$ Torr to about 1 Torr, and at a temperature in a range of about 100° C. to about 400° C. In case that a heat treatment process is performed within the above pressure range, a boiling point of the light-emitting element solvent 220 may be lowered and thus the solvent 220 may be removed more readily. The heat treatment process performed in the chamber may be performed for about 1 minute to about 30 minutes. However, the disclosure is not limited thereto.

As shown in FIG. 4 as described above, the insulating layers and the connection electrodes may be formed. In this way, a display device may be manufactured.

In another embodiment, the organic ligand LIG bonded to the light-emitting element ED may have a positive polarity. The organic ligand LIG may be bonded to a portion of the surface of the insulating film 38 corresponding to the first semiconductor layer 31 and the electrode layer 37 of the light-emitting element ED.

FIG. 21 to FIG. 24 are each a schematic diagram illustrating a method of manufacturing a display device including a light-emitting element according to another embodiment. Hereinafter, descriptions duplicate with those of the embodiment of FIGS. 9 to 20 as described above will be omitted.

Figure 21:
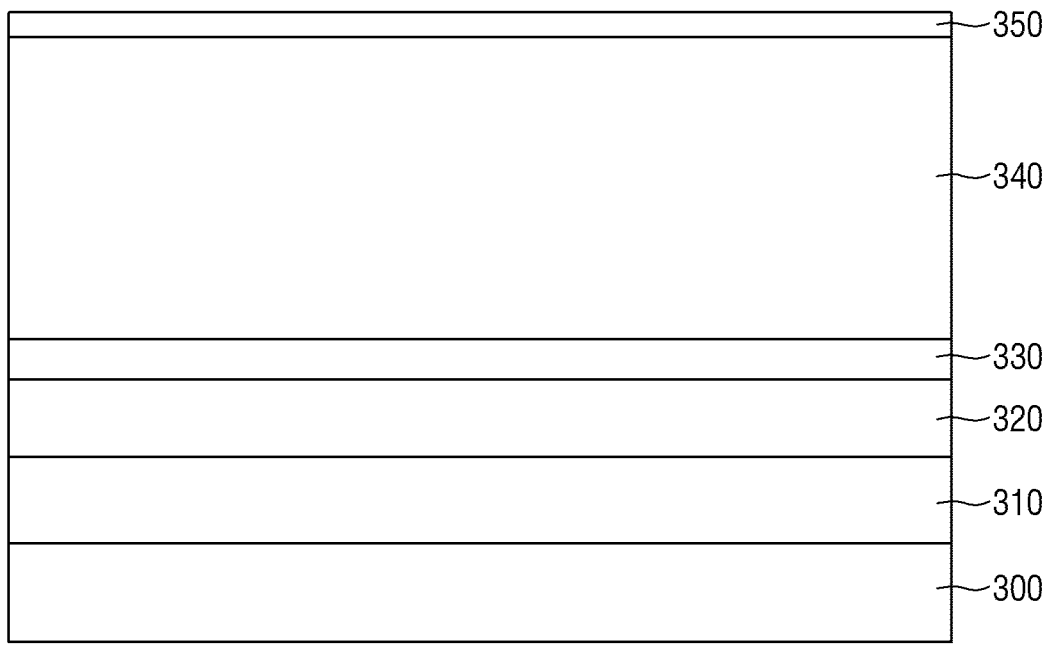
FIG. 21 to FIG. 24 are each a schematic diagram illustrating a method for manufacturing a display device including a light-emitting element according to another embodiment.

Referring to FIG. 21, a buffer layer 310, a second semiconductor material layer 320, a light-emitting material layer 330, a first semiconductor material layer 340, and an electrode material layer 350 may be sequentially deposited on the base substrate 300.

Figure 22:
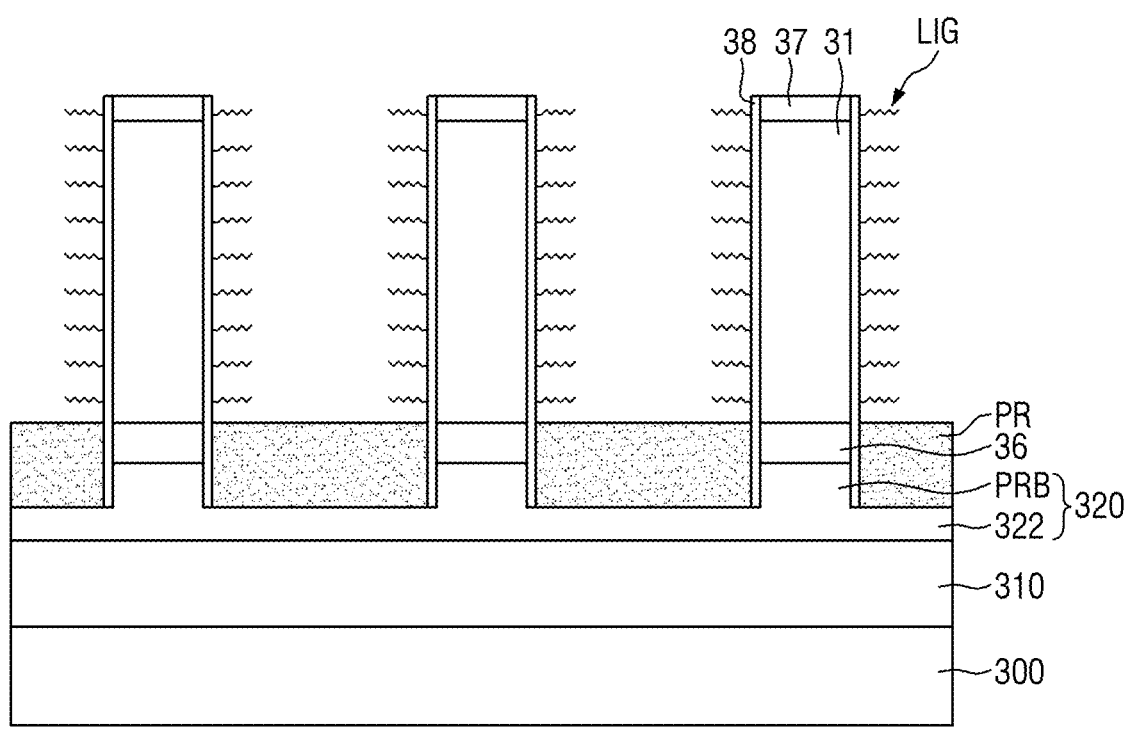

Referring to FIG. 22, the same process as the process in FIG. 10 to FIG. 15 may be performed to form the second semiconductor material layer 320 including a base layer 322 and protrusions PRB on the buffer layer 310, the light-emitting layer 36 disposed on the second semiconductor material layer 320, the first semiconductor layer 31 disposed on the light-emitting layer 36, the electrode layer 37 disposed on the first semiconductor layer 31, and the insulating film 38 surrounding the protrusions PRB, the light-emitting layer 36, the first semiconductor layer 31, and the electrode layer 37.

A photoresist PR may be coated on the base layer 322 of the second semiconductor material layer 320. The photoresist PR may be formed on the base layer 322 of the second semiconductor material layer 320, and may have a thickness such that a top surface thereof is coplanar with a top surface of the light-emitting layer 36. For example, the photoresist PR may be formed such that a portion of the insulating film 38 corresponding to the first semiconductor layer 31 and the electrode layer 37 are exposed.

The base substrate 300 may be immersed in a solution in which the organic ligands LIG are dispersed. The organic ligand LIG may be bonded to an exposed surface of the insulating film 38 located above the photoresist PR. The organic ligand LIG may be an organic ligand LIG with a positive polarity. In embodiments, in case that the insulating film 38 includes aluminum oxide, an electron of a hydrogen atom of the organic ligand LIG and the outermost electron of the oxygen atom of the aluminum oxide may react with each other to create a covalent bond. Therefore, the organic ligand LIG having a positive polarity may be bonded to the surface of the insulating film 38, for example, to a portion of the surface of the insulating film 38 corresponding to the first semiconductor layer 31 and the electrode layer 37. After the bonding of the organic ligand LIG to the surface has been completed, the photoresist PR may be stripped and removed.

Figure 23:
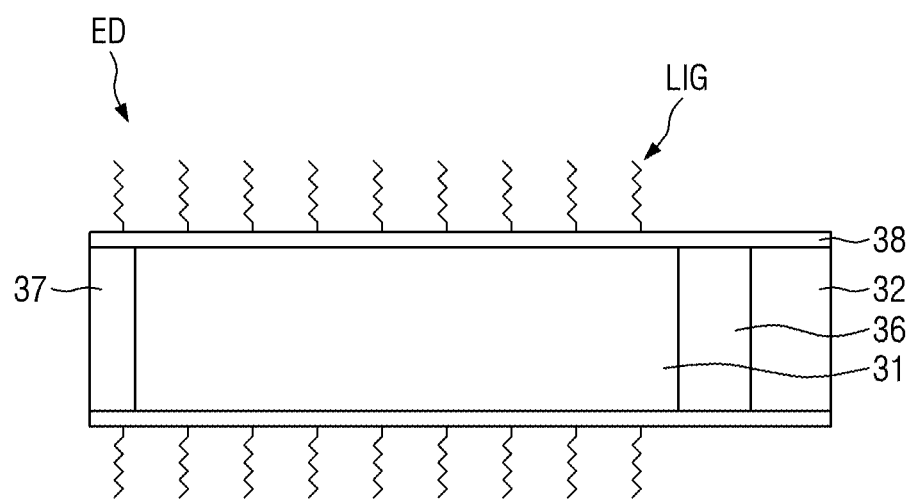
Figure 24:
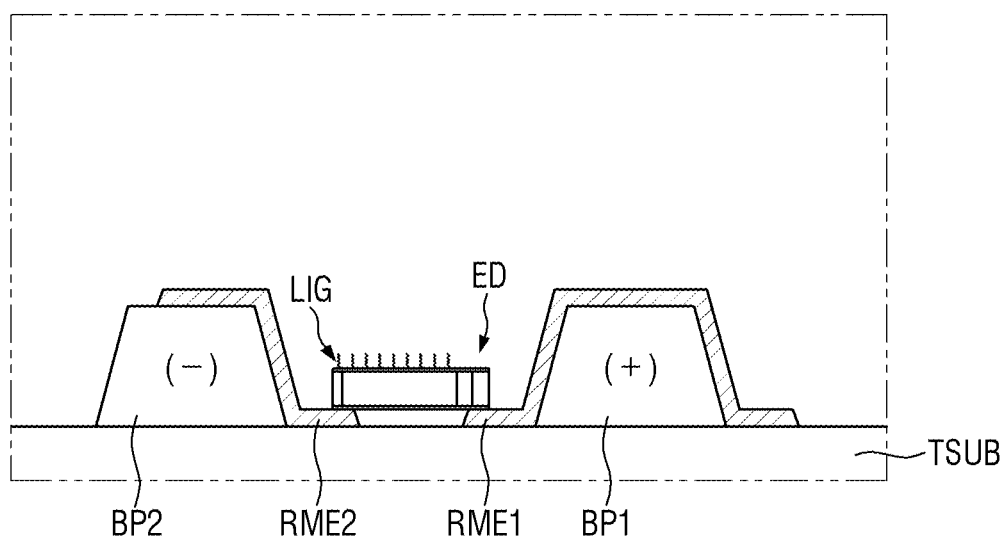

Referring to FIG. 23, the protrusions PRB of the second semiconductor material layer 320 may be separated from the base layer 322 of the second semiconductor material layer 320 in the same manner as described above with reference to FIG. 18. The light-emitting elements ED may be separated from the base substrate 300. Accordingly, each of the light-emitting elements ED may include the first semiconductor layer 31, the light-emitting layer 36, the second semiconductor layer 32, the electrode layer 37, and the insulating film 38 surrounding a circumferential surface thereof. In an embodiment, the organic ligand LIG having a positive polarity may be bonded to a portion of the surface of the insulating film 38 corresponding to the first semiconductor layer 31 and the electrode layer 37.

Referring to 24, a light-emitting element ink including the light-emitting element solvent containing therein the light-emitting elements ED may be sprayed on the target substrate TSUB in the same manner as described above with reference to FIG. 19 and FIG. 20. The direct current power may be applied to the first electrode RME1 and the second electrode RME2 to align the light-emitting elements ED. In embodiments, direct current power may be applied thereto so that the first electrode RME1 has a positive polarity and the second electrode RME2 has a negative polarity. As described above, the light-emitting element ED may have a positive polarity at an end thereof depending on the polarity of the organic ligand LIG. The end of the light-emitting element ED having a positive polarity may move toward the second electrode RME2 having a negative polarity by an electric field, and may directly contact the second electrode RME2. Another end of the light-emitting element ED on which the organic ligand LIG is not disposed may be disposed on the first electrode RME1 and may directly contact the first electrode RME1. Consequently, the light-emitting element ED may be aligned such that an end of the light-emitting element ED is disposed on the second electrode RME2, while another end of the light-emitting element ED is disposed on the first electrode RME1.

The light-emitting element solvent may be removed. The insulating layers and the connection electrodes may be formed to manufacture the display device according to an embodiment.

Figure 25:
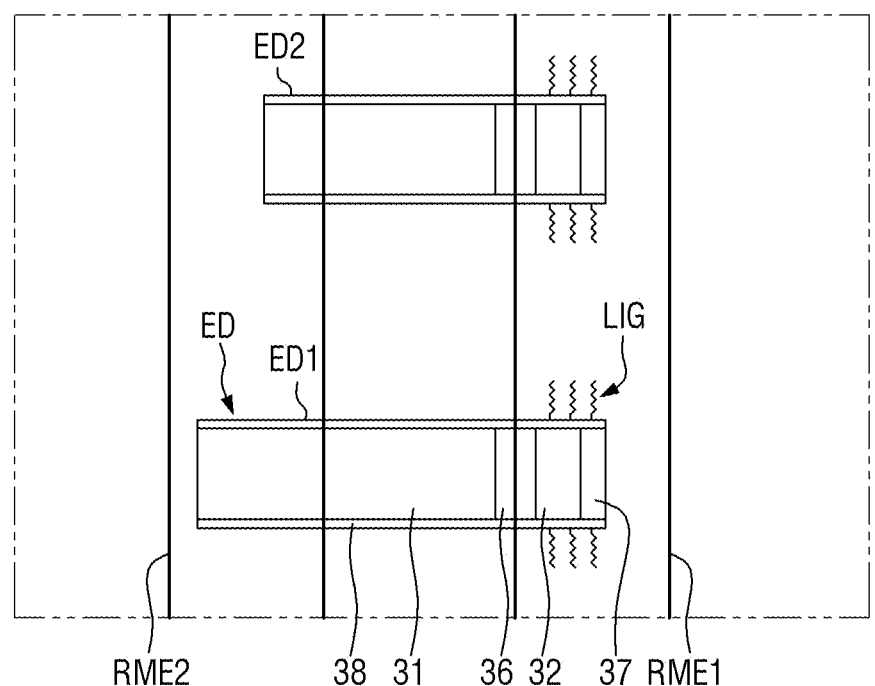
FIG. 25 is a schematic plan view illustrating an example of a state in which light-emitting elements according to an embodiment are disposed on electrodes in an aligned manner.
Figure 26:
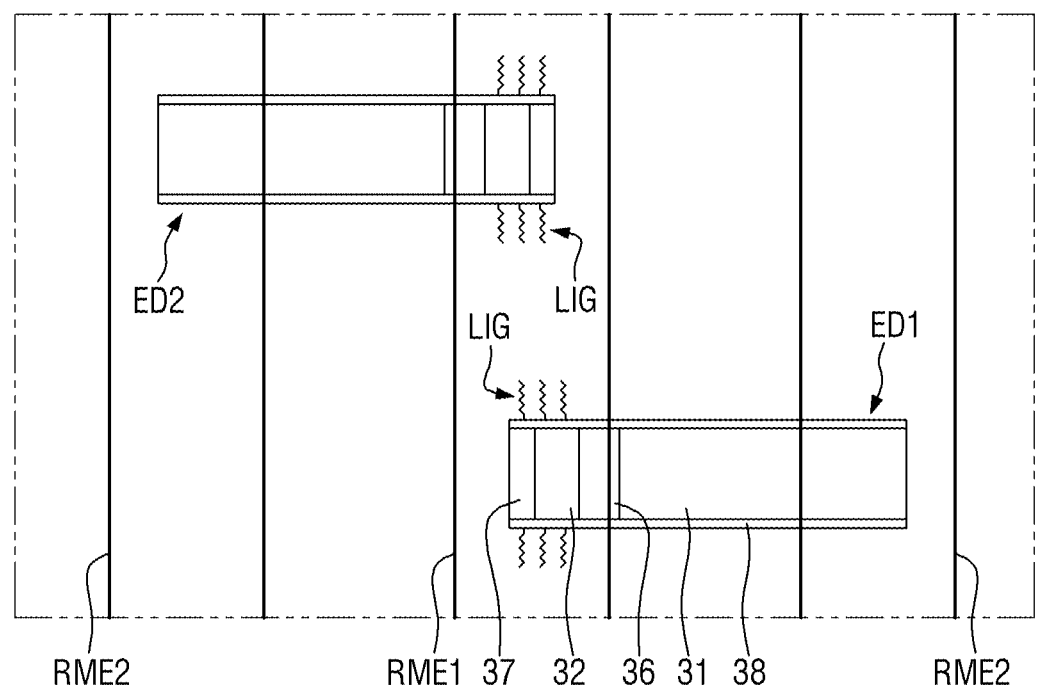
FIG. 26 is a schematic plan view illustrating another example of a state in which light-emitting elements according to an embodiment are disposed on electrodes in an aligned manner.

FIG. 25 is a schematic plan view illustrating an example of a state in which light-emitting elements according to an embodiment are disposed on electrodes in an aligned manner. FIG. 26 is a schematic plan view illustrating another example of a state in which light-emitting elements according to an embodiment are disposed on electrodes in an aligned manner.

Referring to FIG. 25, an organic ligand LIG having a polarity may be bonded to a partial area of the light-emitting element ED according to an embodiment. In embodiments, in case that the organic ligand LIG having a negative polarity is bonded to a portion of the surface of the insulating film 38 corresponding to the electrode layer 37 and the second semiconductor layer 32 of the light-emitting element ED, an end of the light-emitting element ED to which the organic ligand LIG is bonded may be disposed on the first electrode RME1 having a positive polarity.

In the manufacturing method of the light-emitting element ED, the light-emitting elements ED may be separated from the base substrate such that lengths of the light-emitting elements ED may be different from each other. In the embodiment, the organic ligand LIG may be bonded to the partial area of the light-emitting element ED before the separation of the light-emitting element ED from the base substrate. Thus, areas of the light-emitting elements ED to which the organic ligands LIG are bonded may be identical with each other. Even in case that the lengths of the light-emitting elements ED are different from each other, lengths in the first direction DR1 of the light-emitting elements ED in direct contact with the first electrode RME1 may be equal to each other because the areas of the light-emitting elements ED to which the organic ligands LIG are bonded may be identical with each other.

As shown in FIG. 25, the lengths in the first direction DR1 of areas of the light-emitting elements ED overlapping the first electrode RME1 may be equal to each other. Accordingly, even in case that the lengths of the light-emitting elements ED are different from each other, the lengths (or areas) of which the light-emitting elements ED are respectively disposed on the first electrode RME1 may be equal to each other. Thus, an arrangement of the light-emitting layers 36 of the light-emitting elements ED may be uniform, so that luminance of the sub-pixel may be improved. Lengths in the first direction DR1 of the light-emitting elements ED overlapping the second electrode RME2 may be different from each other.

The light-emitting elements ED1 and ED2 may be manufactured such that the organic ligand LIG with a negative polarity may be bonded to a portion of the surface of the insulating film 38 corresponding to the second semiconductor layer 32 and the electrode layer 37. The direct current power may be applied to the electrodes such that the first electrode RME1 has a positive polarity and the second electrode RME2 has a negative polarity. Thus, the light-emitting elements ED1 and ED2 may be aligned in a manner as shown in FIG. 26.

Referring to FIG. 26, the first light-emitting element ED1 may be disposed between the first electrode RME1 and the second electrode RME2 disposed at the right side from the first electrode RME1, and the second light-emitting element ED2 may be disposed between the first electrode RME1 and the second electrode RME2 disposed at the left side from the first electrode RME1, as in the same manner as shown in FIG. 3. The second semiconductor layer 32 and the electrode layer 37 of the first light-emitting element ED1 may be disposed on the first electrode RME1 and overlap the first electrode RME1, and the second semiconductor layer 32 and the electrode layer 37 of the second light-emitting element ED2 may be disposed on the first electrode RME1 and overlap the first electrode RME1. The second semiconductor layer 32 of the first light-emitting element ED1 and the second semiconductor layer 32 of the second light-emitting element ED2 may overlap each other in the second direction DR2 in a plan view.

In one embodiment, the light-emitting layer 36 of the first light-emitting element ED1 may be disposed adjacent to the first electrode RME1, and the light-emitting layer 36 of the second light-emitting element ED2 may be disposed adjacent to the first electrode RME1. In another embodiment, the light-emitting layer 36 of the first light-emitting element ED1 may at least partially overlap the first electrode RME1, and the light-emitting layer 36 of the second light-emitting element ED2 may at least partially overlap the first electrode RME1.

According to the above-described embodiment, the light-emitting layer 36 of each of the light-emitting elements ED1 and ED2 may be disposed adjacent to the first electrode RME1, which is disposed at a center of the sub-pixel. Thus, light from the light-emitting layer 36 of each of the light-emitting elements ED1 and ED2 may be emitted in the central area of the sub-pixel, thereby improving luminance of the device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A display device comprising:
a first electrode and a second electrode disposed on a substrate, spaced apart from each other, and extending in a direction;
a plurality of light-emitting elements disposed on the first electrode and the second electrode;
an organic ligand having a polarity that is bonded to a portion of each of the plurality of light-emitting elements;
a first connection electrode electrically connected to an end of each of the plurality of light-emitting elements; and
a second connection electrode electrically connected to another end of each of the plurality of light-emitting elements,
wherein the end of each of the plurality of light-emitting elements electrically contacts the first electrode,
the another end of each of the plurality of light-emitting elements electrically contacts the second electrode
wherein each of the plurality of light-emitting elements includes:
a first semiconductor layer including an n-type semiconductor;
a second semiconductor layer disposed on the first semiconductor layer and including a p-type semiconductor;
a light-emitting layer disposed between the first semiconductor layer and the second semiconductor layer; and
an insulating film surrounding a circumferential surface of each of the first semiconductor layer, the second semiconductor layer, and the light-emitting layer,
the organic ligand being bonded to a surface of the insulating film, and
wherein the organic ligand is not bonded to a portion of the surface of the insulating film corresponding to the light-emitting layer.

2. The device of claim 1, wherein
the organic ligand has a negative polarity, and
the organic ligand includes oleic acid or PEG-COOH.

3. The device of claim 2, wherein the organic ligand is bonded to a portion of the surface of the insulating film corresponding to the second semiconductor layer.

4. The device of claim 2, wherein
each of the plurality of light-emitting elements further includes an electrode layer disposed on the second semiconductor layer, and
the organic ligand is bonded to a portion of the surface of the insulating film corresponding to the second semiconductor layer and the electrode layer.

5. The device of claim 4, wherein the organic ligand is not bonded to a portion of the surface of the insulating film corresponding to the first semiconductor layer.

6. The device of claim 1, wherein
the organic ligand has a positive polarity, and
the organic ligand includes n-octyl mercaptan, PEG-NH$_2$, or oleylamine.

7. The device of claim 6, wherein the organic ligand is bonded to a portion of the surface of the insulating film corresponding to the first semiconductor layer.

8. The device of claim 6, wherein
each of the plurality of light-emitting elements further includes an electrode layer disposed on the first semiconductor layer, and
the organic ligand is bonded to a portion of the surface of the insulating film corresponding to the first semiconductor layer and the electrode layer.

9. The device of claim 8, wherein the organic ligand is not bonded to a portion of the surface of the insulating film corresponding to the second semiconductor layer.

10. The device of claim 1, wherein
at least two of the plurality of light-emitting elements have different lengths from each other,
the at least two of the plurality of light-emitting elements each has an area overlapping the first electrode or the second electrode in a plan view, and
a length of each of the overlapping areas are equal to each other.

11. An electronic device comprising:
a first electrode disposed on a substrate and extending in a direction;
second electrodes disposed on the substrate and extending in the direction;
a first light-emitting element disposed on one of the second electrodes and the first electrode; and
a second light-emitting element disposed on the other of the second electrodes and the first electrode,
wherein the first electrode is disposed between the second electrodes,
an organic ligand having a polarity is bonded to a portion of each of the first light-emitting element and the second light-emitting element,
the portion of each of the first light-emitting element and the second light-emitting element overlaps the first electrode in a plan view,
wherein each of the first light-emitting element and the second light-emitting element includes:
a first semiconductor layer including an n-type semiconductor;
a second semiconductor layer disposed on the first semiconductor layer and including a p-type semiconductor;
a light-emitting layer disposed between the first semiconductor layer and the second semiconductor layer; and
an insulating film surrounding a circumferential surface of each of the first semiconductor layer, the second semiconductor layer, and the light-emitting layer, and
the organic ligand being bonded to a portion of a surface of the insulating film corresponding to the second semiconductor layer, and
wherein the organic ligand is not bonded to a portion of the surface of the insulating film corresponding to the light-emitting layer.

12. The device of claim 11, wherein the second semiconductor layers of each of the first light-emitting element and the second light-emitting element overlaps the first electrode in a plan view.

13. A method for manufacturing a display device, the method comprising:
sequentially stacking a first semiconductor material layer, a light-emitting material layer, a second semiconductor material layer, and an electrode material layer on a base substrate;
etching the first semiconductor material layer, light-emitting material layer, the second semiconductor material layer, and the electrode material layer to form the first semiconductor material layer including a base layer and protrusions, a light-emitting layer, a second semiconductor layer, and an electrode layer, respectively;
forming an insulating film surrounding the protrusions of the first semiconductor material layer, the light-emitting layer, the second semiconductor layer, and the electrode layer;
forming a photoresist such that the second semiconductor layer, the electrode layer, and a portion of the insulating film corresponding to the second semiconductor layer and the electrode layer are each exposed;
bonding an organic ligand having a polarity to the portion of the insulating film;
forming light-emitting elements by separating the protrusions of the first semiconductor material layer from the base layer of the first semiconductor material layer;
spraying light-emitting element ink including the light-emitting elements on a target substrate on which a first electrode and a second electrode spaced apart from each other are formed; and
aligning the light-emitting elements by applying an alignment signal to the first electrode and the second electrode.

14. The method of claim 13, wherein the alignment signal is direct current (DC) power.

15. The method of claim 13, wherein
the organic ligand is bonded to an end of each of the light-emitting elements, and
in the aligning of the light-emitting elements, the end of each of the light-emitting elements moves to the first electrode or the second electrode having a polarity opposite to the polarity of the organic ligand.

16. The method of claim 13, wherein the bonding of the organic ligand includes immersing the base substrate into a solution containing the organic ligand.

17. The method of claim 13, wherein the method further comprises removing the photoresist after bonding the organic ligand to the portion of the insulating film.

18. The method of claim 13, wherein the organic ligand includes at least one selected from a group consisting of oleic acid, PEG-COOH, n-octyl mercaptan, PEG-NH$_2$, and oleylamine.

* * * * *